(12) United States Patent
Bencivenga et al.

(10) Patent No.: US 10,869,407 B2
(45) Date of Patent: Dec. 15, 2020

(54) LINEAR AIR FLOW DISTRIBUTION FOR A COOLING SYSTEM

(71) Applicant: ARRIS Enterprises LLC, Suwanee, GA (US)

(72) Inventors: Ernest Bencivenga, Hooksett, NH (US); Thomas D. Fillio, Newton, NH (US)

(73) Assignee: ARRIS Enterprises LLC, Suwanee, GA (US)

( * ) Notice: Subject to any disclaimer, the term of this patent is extended or adjusted under 35 U.S.C. 154(b) by 303 days.

(21) Appl. No.: 15/440,728

(22) Filed: Feb. 23, 2017

(65) Prior Publication Data

US 2017/0245391 A1    Aug. 24, 2017

Related U.S. Application Data

(60) Provisional application No. 62/298,632, filed on Feb. 23, 2016.

(51) Int. Cl.
*H05K 5/00* (2006.01)
*H05K 7/20* (2006.01)

(52) U.S. Cl.
CPC ....... *H05K 7/2019* (2013.01); *H05K 7/20145* (2013.01); *H05K 7/20172* (2013.01); *H05K 7/20181* (2013.01); *H05K 7/20209* (2013.01)

(58) Field of Classification Search
CPC ............. H05K 7/2019; H05K 7/20145; H05K 7/20172; H05K 7/20181; H05K 1/20209

USPC ........................................................ 454/184
See application file for complete search history.

(56) References Cited

U.S. PATENT DOCUMENTS

2008/0056900 A1    3/2008  Seidler
2008/0151490 A1*   6/2008  Fan .......................... G06F 1/20
                                                 361/679.47

OTHER PUBLICATIONS

PCT Search Report & Written Opinion, Re: Application No. PCT/US2017/019145, dated May 17, 2017.

* cited by examiner

*Primary Examiner* — Helena Kosanovic
(74) *Attorney, Agent, or Firm* — Chernoff, Vilhauer, McClung & Stenzel, LLP

(57) ABSTRACT

An air flow distribution system for a plurality of fans includes an air collimator that is operable to pass a flow of air in a linear vertical direction, thereby creating an improved optimal flow direction for cooling device components. The air collimator includes air transfer diverters to redirect swirling air from a fan into a linear flow, thereby increasing the cross-sectional air flow distribution throughout the device being cooled. Self-activating, separately controlled plurality of louver systems automatically close upon failure of an associated one of a plurality of cooling fans to prevent air from recirculating back through the failed fan. Therefore, air continues to move in a linear direction across the device components such that the device components remain at a specified temperature.

13 Claims, 23 Drawing Sheets

LINEAR AIR FLOW DISTRIBUTION FOR A COOLING SYSTEM

This application claims priority from U.S. Provisional No. 62/298,632, entitled "Linear Air Flow Distribution For a Cooling System", filed Feb. 23, 2016, the entirety of which is expressly incorporated herein by reference.

BACKGROUND OF THE INVENTION

1. Field of the Invention

The present invention relates to improved designs for forced air flow in a cooling system including multiple fans.

2. Background of Related Art

Fan-driven cooling systems are commonplace. In a conventional fan-driven cooling system, fan-driven air flow is pushed across at least one heat sink or component so as to cool and thus reduce the temperature of the heat sink and/or component.

Many conventional systems utilize fan-driven air-flow cooling systems. However, the present inventors have appreciated that conventional system air flow distribution may not reliably and consistently maintain a linear flow of air over the heat sink of many types of devices (e.g., network headend device such as a cable modem termination system (CMTS)).

Moreover, making conventional systems even worse, typical air flow distribution system designs create an inefficient recirculation of air when the system experiences a fan failure or other outage of a fan. For example, when a system fan fails in a fan tray, air from the one or more fans that are still operational begins exhausting/recirculating through the failed fan, thereby reducing the volume of air passing through the system. This is problematic particularly in a system designed to operate 24/7. Detection of the failure of a single fan in a multiple fan system may not readily be apparent to operators of the devices, particularly large scale systems or rack-mounted systems. And even if detected, repair and replacement may require outage of the device being cooled.

FIG. 16 shows a conventional air cooling system including three fans blowing cooling air toward a number of heat sinks of devices through a conventional air collimator.

In particular, the heat sinks of one or more devices (represented by 950) are cooled by the output of a plurality of cooling fans 505, 605, 705. The air flow is depicted by arrows 960. The air flow 960 is directed in a linear direction toward the heat sinks of the devices 950 by a conventional air grill or collimator 900.

A designer will have specified a number of fans required to maintain the heat sinks of the device 950 at a suitably cool temperature, e.g., three fans 505, 605, 705 as shown in FIG. 8.

SUMMARY OF THE INVENTION

In accordance with the principles of the present invention, an air cooling system comprises a plurality of fans. An air collimator is adapted to direct forced air flow by each of the plurality of fans toward at least one device to be cooled. A plurality of self-activating, separately controlled louver systems are mounted to the air collimator, wherein at least one but not all of the plurality of self-activating, separately controlled louver systems are adapted to self-close upon cessation of air flow from one of the plurality of fans to block air from passing back through an associated one of the plurality of fans when the associated one of the plurality of fans is off.

In other embodiments, an air collimator for a multiple forced air-source air cooling system comprises an air collimator adapted to direct forced air flow by each of a plurality of separate air sources toward at least one device to be cooled. A plurality of self-activating, separately controlled louver systems mounted to the air collimator, wherein the plurality of self-activating, separately controlled louver systems are each adapted to self-close individually upon cessation of air flow from one of the plurality of separate air sources to block air from passing back through the self-closed self-activating, separately controlled louver system.

A method of providing consistent linear flow across a device from a multiple-fan air cooling system in accordance with another so aspect of the present invention comprises passing the output from a plurality of fans through an air collimator toward at least one device to be cooled, the air collimator including a plurality of self-activating, separately controlled louver systems mounted to the air collimator. The plurality of self-activating, separately controlled louver systems mounted to the air collimator are each self-closed individually upon cessation of air flow from a failed one of the plurality of fans while the remaining plurality of fans continue to force air through the air collimator, the closed self-activating, separately controlled louver system blocking air from passing back through the failed one of the plurality of fans while the remaining plurality of fans continue to pass air through the air collimator. Thus, the louver system above the failed one of the plurality of cooling fans closes to block passage of air flow from any of the remaining plurality of fans from passing therethrough.

BRIEF DESCRIPTION OF THE DRAWINGS

Features and advantages of the present invention will become apparent to those skilled in the art from the following description with reference to the drawings, in which.

DETAILED DESCRIPTION

The inventors hereof have appreciated that fan-driven air flow creates a swirling pattern which is a less efficient and predictable cooling flow than a linear vertical flow. Thus, typical air flow distribution systems create a low pressure area at or around fan hubs. The low pressure area causes a recirculation of air above the fan hub, thus minimizing air flow/cooling across heat sinks and components. The inventors recognized that this low pressure area is undesirable, and generally prevents a linear flow of air through the system.

While conventional designs may have contemplated accommodation of the failure of a single fan by designing an additional fan into cooling system, the present inventors have appreciated the detrimental effects on the linear flow of air across the heat sinks of the devices intended to be kept cool upon the failure of even a single fan.

Figure 17:
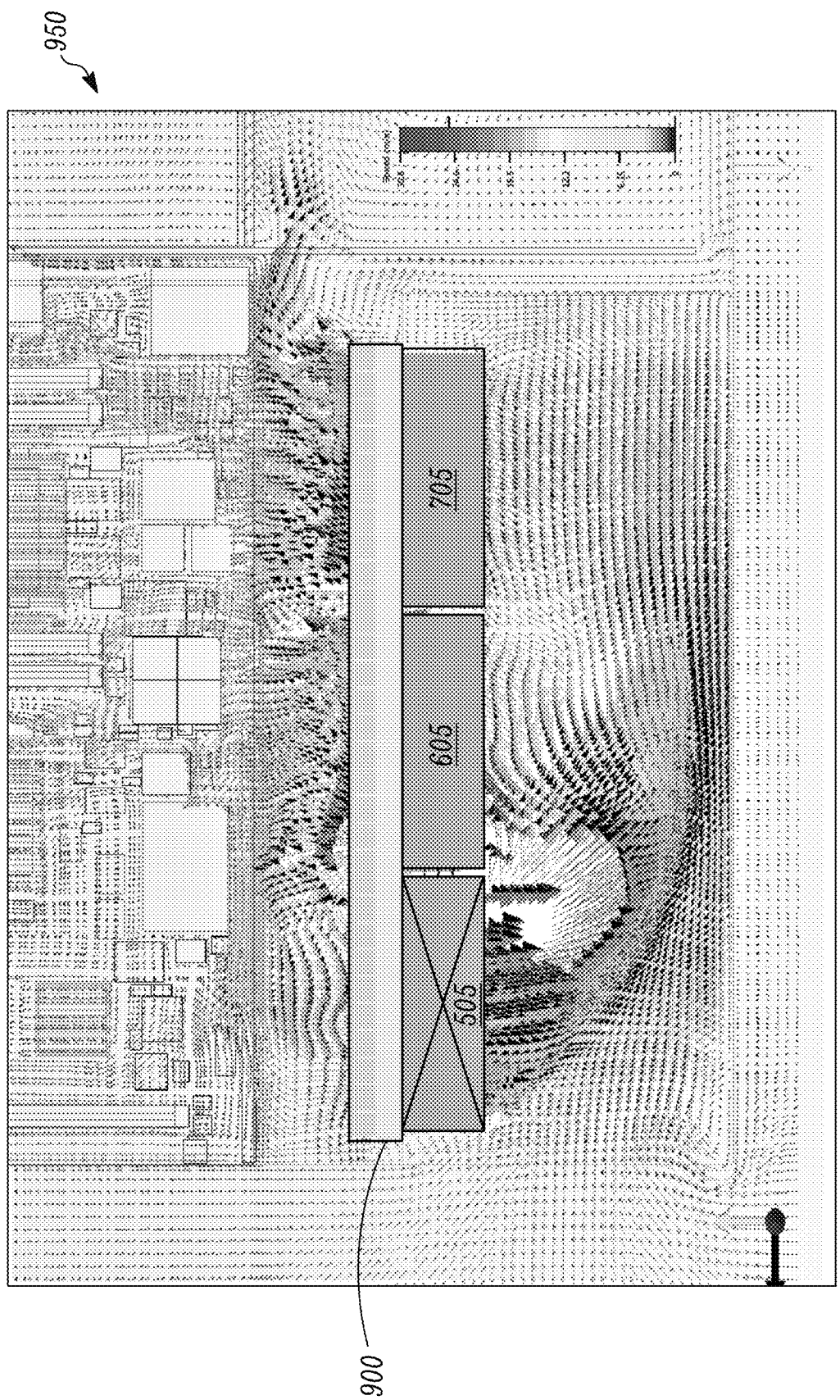
FIG. 17 shows exemplary computational fluid dynamic results with velocity vectors demonstrating the recirculation that occurs when a front fan fails in a conventional multiple fan air cooling system.

FIG. 17 shows exemplary computational fluid dynamic results with velocity vectors demonstrating the recirculation that occurs when a front fan 505 fails in a conventional multiple fan air cooling system.

In particular, as shown in FIG. 17, a fan tray in this example contains three active fans: front fan 505, middle fan 605, and rear fan 705. When the front fan 505 fails, the present inventors have appreciated that a significant amount of the cooling air flow exhausts through the front fan 505 in a negative direction (as can be seen by the negative 'y-direction' vectors passing back through the front fan 505 opposite to the cooling direction of air flow).

As can be seen in FIG. 17, a significant portion of the air within the system exhausts and recirculates through the failed front fan 505. This significantly disrupts the linear flow and reduces the volume of the cooling air across the heat sinks of the devices 950 intended to be cooled by the air flow, thus significantly changing the temperature of the heat sinks and/or component of at least some of the devices being cooled.

Figure 18:
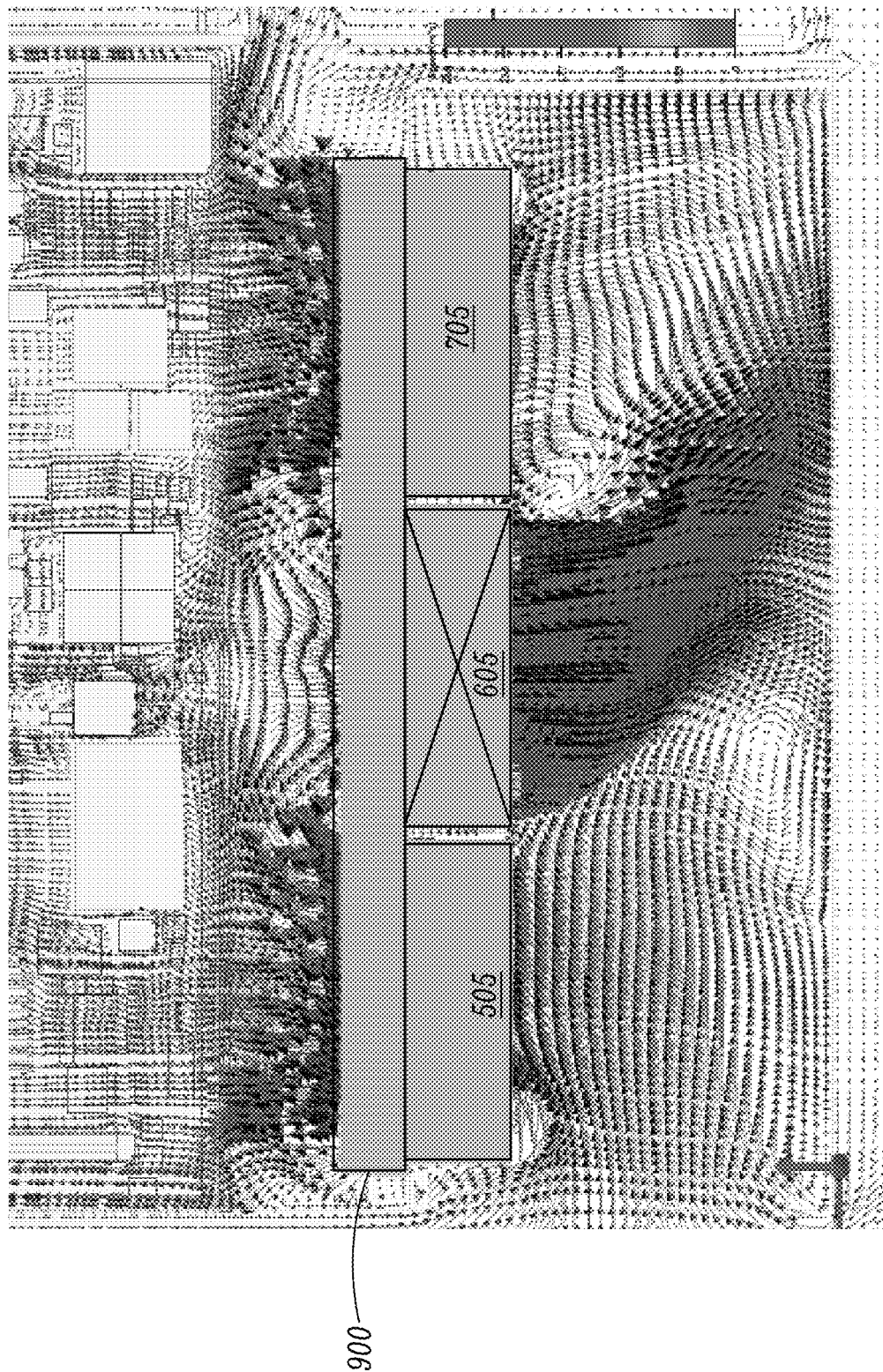
FIG. 18 shows exemplary computational fluid dynamic results with velocity vectors demonstrating the recirculation that occurs when a middle fan fails in a conventional multiple fan air cooling system.

FIG. 18 shows exemplary computational fluid dynamic results with velocity vectors demonstrating the recirculation that occurs when a middle fan 605 fails in a conventional multiple fan air cooling system.

In particular, as shown in FIG. 18, when the middle fan 605 fails, the present inventors have appreciated that a significant amount of the cooling air flow exhausts through the failed middle fan 605 in a negative direction (as can be seen by the negative 'y-direction' vectors passing back through the middle fan 605 opposite to the cooling direction of air flow).

As can be seen in FIG. 18, a significant portion of the air within the system exhausts and recirculates through the failed middle fan 605, thus disrupting the linear flow and reduces the volume of the cooling air across the heat sinks of the devices 950 intended to be cooled by the air flow, thus significantly changing the temperature of the heat sinks and/or components of at least some of the devices being cooled.

Figure 19:
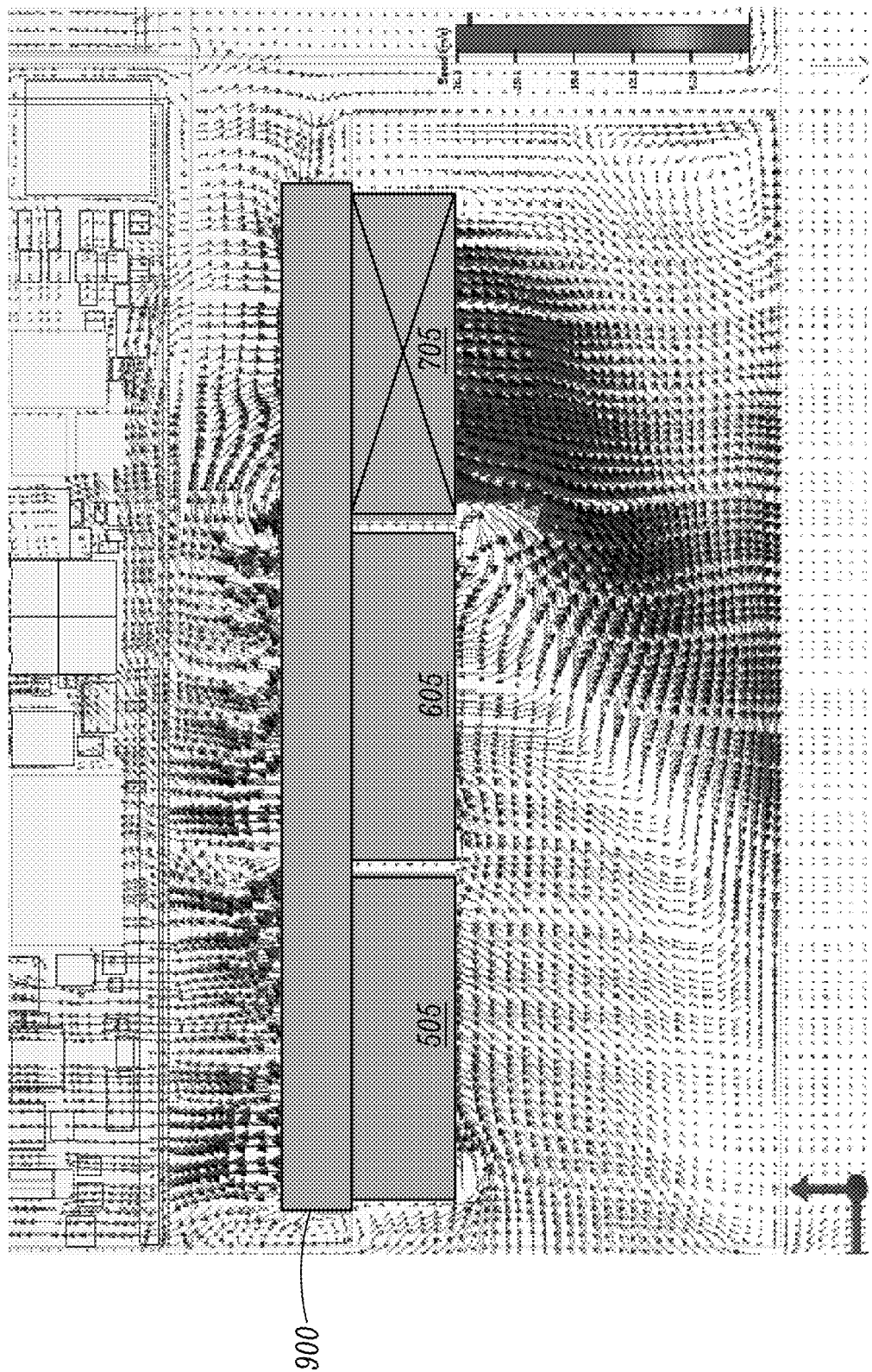
FIG. 19 shows exemplary computational fluid dynamic results so with velocity vectors demonstrating the recirculation that occurs when a rear fan fails in a conventional multiple fan air cooling system.

FIG. 19 shows exemplary computational fluid dynamic results with velocity vectors demonstrating the recirculation that occurs when a rear fan 705 fails in a conventional multiple fan air cooling system.

In particular, as shown in FIG. 19, when a rear fan 705 fails, the present inventors have appreciated that a significant amount of the cooling air flow exhausts back through the failed rear fan 705 in a negative direction (as can be seen by the negative 'y-direction' vectors passing back through the rear fan 705 opposite to the cooling direction of air flow).

As can be seen in FIG. 19, a significant portion of the air within the system exhausts and recirculates through the failed rear fan 705, thus disrupting the linear flow and reduces the volume of the cooling air across the heat sinks of the devices 950 intended to be cooled by the air flow, thus significantly changing the temperature of the heat sinks and/or components of at least some of the devices being cooled.

The present inventors have recognized that a need exists for an improved air flow distribution system that is capable of maintaining a linear air flow in the event of a fan failure.

The invention provides an improved air flow distribution system that is operable to pass a flow of air in a linear vertical direction, thereby creating an improved optimal flow direction for cooling device components. The system described herein utilizes an improved air collimator that is operable to redirect swirling air from a fan into a linear flow, thereby increasing the cross-sectional air flow distribution throughout the device being cooled.

Importantly, the improved air cooling system described herein further includes separate self-activating louver systems that close off air flow back to individual fans. The separate self-activating louver systems within the air collimator automatically individually close upon failure of any of a plurality of fans to prevent air from recirculating through the failed fan. Therefore, even when just one fan fails (or is otherwise shut off for service, maintenance, etc.), air continues to move linearly across the device components such that the device components remain cooled to a specified temperature.

Thus in the conventional air cooling system air is allowed to pass back through a failed fan due to the creation of a low pressure region within the system, thus air flow would begin recirculating upon fan failure rather than flowing linearly out of the air cooling system. This re-circulation of air can be warmer air that then creates unwanted heat within the heat sink and/or component. As a result, the amount of power that can be safely dissipated within the chassis of the device is limited, preventing safe and reliable increases in circuit or component density within the relevant device.

Figure 1:
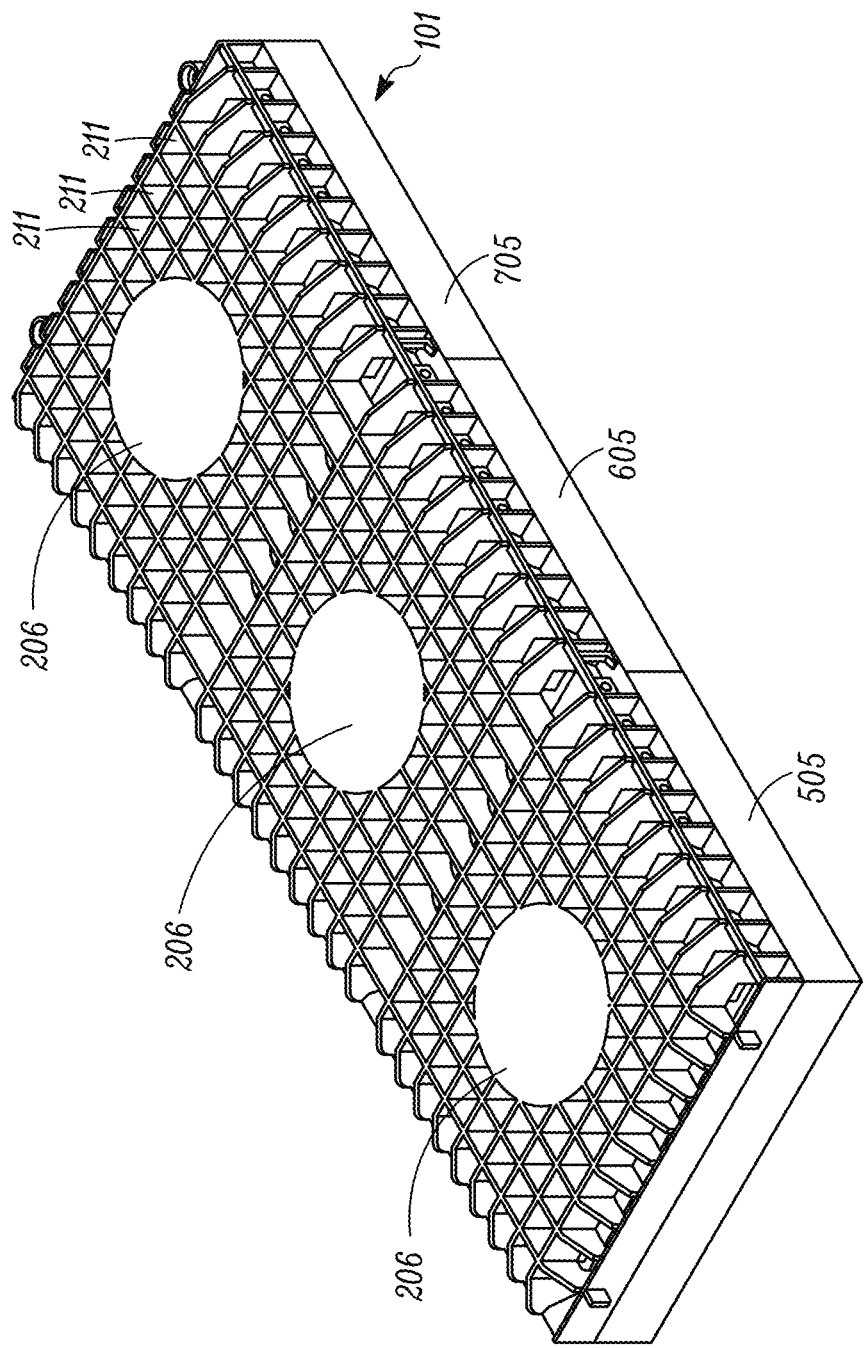
FIG. 1 shows a perspective top view of an example air collimator including a cylindrical air transfer diverter for each fan and an integrated self-activating louver system associated with each fan, in accordance with the principles of the invention.

FIG. 1 shows a perspective top view of an example air collimator 101 including a cylindrical air transfer diverter 206 for each fan 505, 605, 705 and an integrated self-activating louver system associated with each fan, in accordance with the principles of the invention.

In particular, as shown in FIG. 1, an exemplary air collimator 101 may include a plurality of rectangular openings that are spread across the air collimator 101 as a grid. While shown with square shaped openings in the air collimator 101, the openings may instead be square, quadrilateral, quadrangle, rhombus, or even form parallelograms, in accordance with the principles of the invention.

Figure 4A:
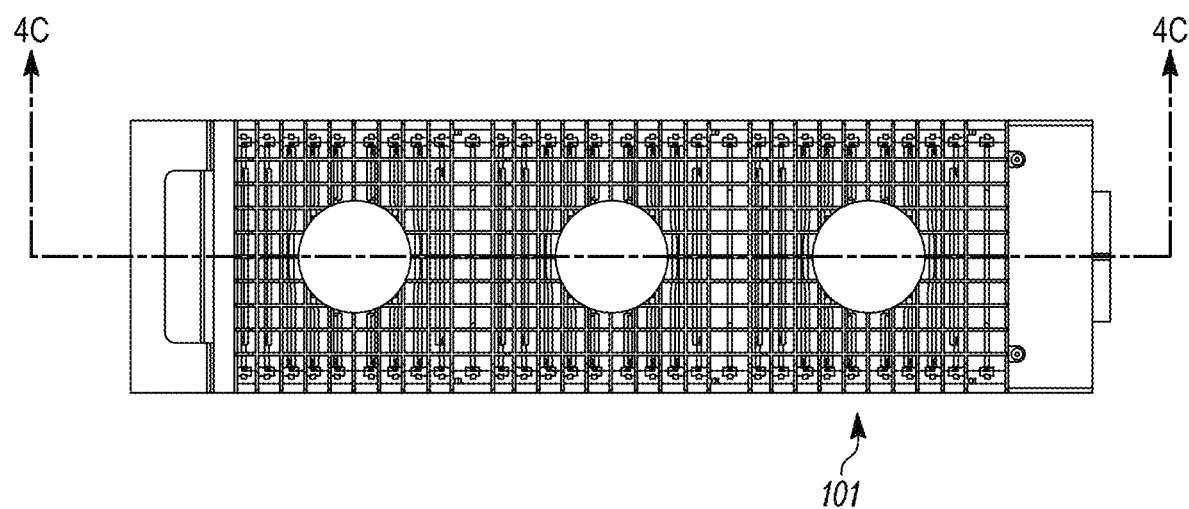
FIGS. 4A to 4D are top (FIG. 4A), side (FIG. 4B), rear (FIG. 4D) and cutaway (FIG. 4C) views showing the exemplary fan tray of FIGS. 3A and 3B.
Figure 4B:
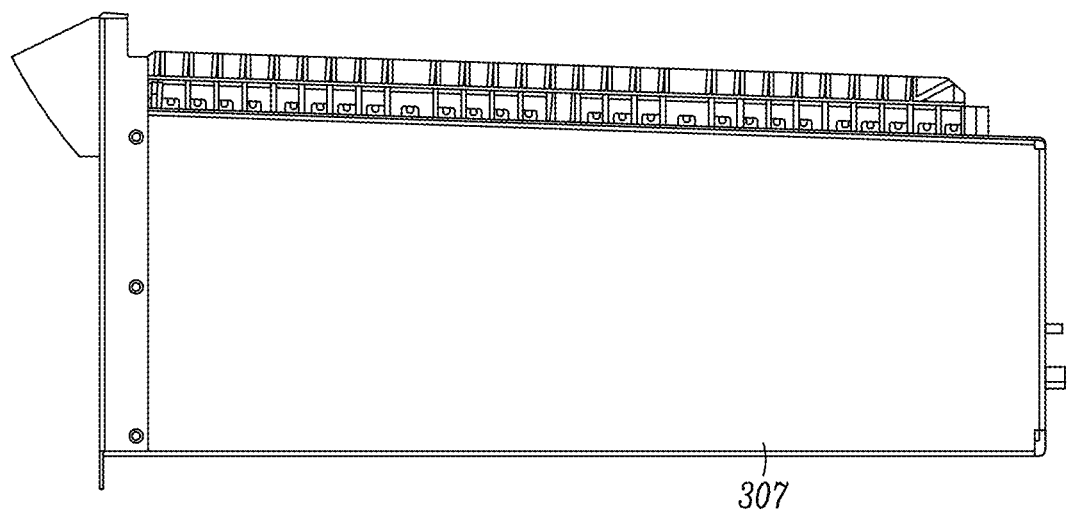
Figure 4C:
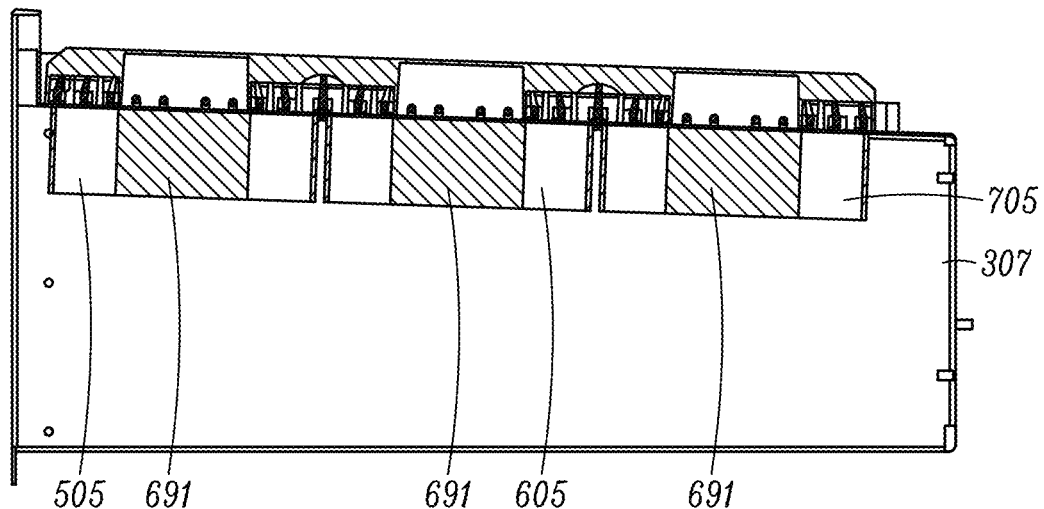
Figure 4D:
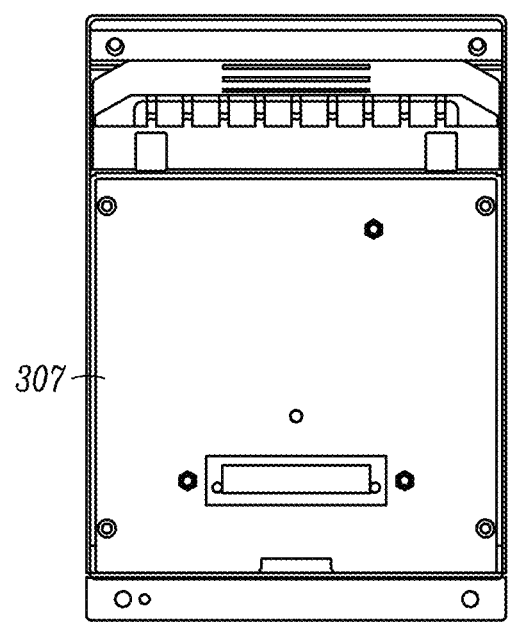

In certain embodiments, the air collimator 101 includes an air transfer diverter 206 associated with each fan to create a linear flow of air from the circulating air flow of the fan. The air transfer diverters 206 are cylindrical shaped in the shown embodiment. The cylindrical shaped air transfer diverter may be integrally formed in the air collimator 101 as shown in FIG. 1, or the cylindrical shaped air transfer diverter 206 may be separately formed and fastened to the air collimator 101 in any appropriate fashion, e.g., using a plurality of fastening tabs for attaching one or more air transfer diverters 206 to the air collimator 101. In embodiments the air transfer diverters 206 are sized and positioned to cover respective fan hubs 691 (FIG. 4C).

Air flow distribution provided by the air collimator 101 including air transfer diverters 206 and separately activated louver systems as described herein facilitates and maintains a linear flow of air across the heat sinks and/or components of cooled devices to reliably and consistently maintain the operating temperature of the device components at a preferred temperature—even after the failure or outage of any one of a multiple number of cooling fans in the air cooling system.

In embodiments, the air flow distribution system may be installed within or otherwise attached to a headend device such as a CMTS. The air flow distribution system described herein includes an air collimator 101 comprising a plurality of openings 211 and a plurality of air transfer diverter 206 that are operable to accept and redirect air from a plurality of fans 505, 605, 705. The air collimator 101 has a matrix of openings 211 and a shaped air transfer diverter 206 (e.g., cylindrical shaped, cone shaped, cup shaped, etc.) located in the air collimator 101 above each fan hub 505, 605, 705 to re-direct the swirling air flow pattern from individual fans 505, 605, 705 into a linear flow of air in the vertical direction above the fans, creating an improved optimal flow direction for cooling. The air collimator 101 increases the cross-sectional air flow distribution throughout the device while minimizing a low pressure area over any of the fan hubs 505, 605, 705 that would otherwise cause recirculation. The matrix of openings 211 converts angular and swirling flow into a linear flow.

Each air transfer diverter 206 redirects swirling air received from a fan into a linear vertical flow that is passed over one or more device components being cooled.

Figure 2:
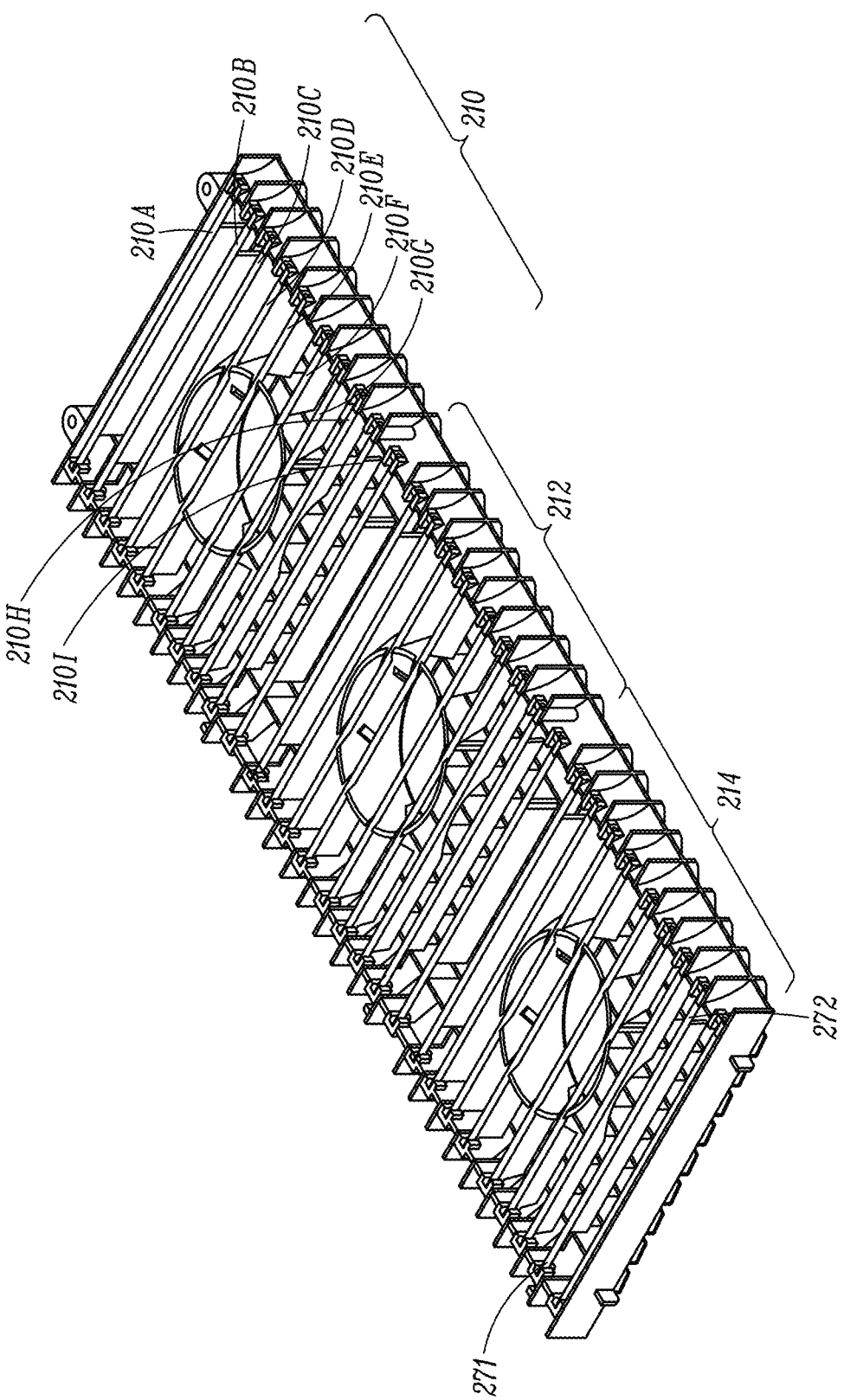
FIG. 2 shows a perspective bottom view of an exemplary air collimator including cylindrical air transfer diverters and integrated self-activating, separately controlled louver systems all in an open position, in accordance with an embodiment of the invention.

FIG. 2 shows a perspective bottom view of an exemplary air collimator 101 including cylindrical air transfer diverters 206 and integrated self-activating, separately controlled louver systems all in an open position, in accordance with an embodiment of the invention.

In particular, as shown in FIG. 2, the air collimator 101 includes a plurality of cylindrical air transfer diverters 206. Each air transfer diverter 206 prevents a low pressure volume from occurring over each fan hub 691. The cylindrical air transfer diverters 206 prevent the low pressure volume over the fan hub 691. The square or rectangular matrix of openings 211 convert swirling air flow into linear air flow. The louvers of the individually controlled, self-activating louver systems 210, 212, 214 prevent failed fan recirculation.

Thus, in a multi-fan system, gravity and/or air pressure from the remaining operating fans will close separately controlled, individually activated louvers. Upon reactivation of a failed fan, the closed louvers will re-open.

The air transfer diverter mechanisms 206 allow air passing around the air transfer diverter mechanisms 206 to be streamlined into a linear flow. Though shown in FIGS. 1 and 2 as cylindrical shaped, it should be understood that the air transfer diverter 206 may be designed as other shapes as well (e.g., cylinders, funnel, cup).

While only three air transfer diverters 206 are shown in the disclosed embodiments of the air collimator 101, it should be understood by those of ordinary skill that the number of air transfer diverters 206 within a given air collimator 101 may vary. For example, the number of air transfer diverters 206 within an air collimator 101 may be equivalent to the number of fans used to draw or force air through the air collimator 101.

Moreover, while the air collimator 101 is shown with respect to air forced through the air collimator 101, the invention may be implemented in an air cooling system that draws air out from the air collimator 101, though in such an arrangement the air collimator 101 would not work to modify swirling air flow into a linear air flow. In such a draw system, the active louver systems are adapted to actively close when an associated fan fails. For instance, a spring may be adapted on each individual louver sufficient to close the louver when air ceases to be drawn through by an associated fan.

The air collimator 101 importantly includes individually controlled louver systems 210, 212, 214. Each individual louver 210a-210i of the louver systems 210, 212, 214 may be attached to the air collimator 101 at two points (e.g., 271, 272) in such a way as to allow each individual louver of the louver systems 210, 212, 214 to freely rotate about an axis created between the two connection points 271, 272.

For example, in the disclosed embodiments, while an associated fan is blowing air through the air collimator 101, the pressure differential created by the fan forces each individual louver of a given louver system 210, 212, 214 open, but if an associated fan stops running, is turned off, or otherwise fails, gravity will cause the individual louvers associated with an individually controlled louver system 210, 212, 214 impacted by the stopped or failed fan to close. When closed, air is substantially prevented from passing back through the closed louver system 210, 212, 214.

While disclosed embodiments utilize an orientation of the air so collimator to force air upwards in a linear direction such that the louvers may utilize gravity to fall closed in a given direction. However, the present invention is equally applicable to other orientations using gravity, or air pressure from remaining operative fan(s), or active force such as spring force to close the louvers when air pressure ceases to maintain the louvers in an open position.

Thus in disclosed embodiments, the air collimator 101 includes self-activating individually controlled louver systems 210, 212, 214 wherein the louvers of each separate louver system 210, 212, 214 are held open while sufficient air pressure is applied to those louvers by the output of a respective one of the fans 505, 605, 705. The louvers are oriented such that upon the failure of the one fan 505, 605, 705 that is providing the sufficient pressure to maintain the louver in an open position while forcing air to pass through the louvers, gravity will force those louvers of that separately controlled louver system to close over just the failed fan, thereby preventing air from recirculating back through the failed fan.

Thus, all of the relevant louvers of all of the separately controlled louver systems 210, 212, 214, are open when all fans are operational. However, upon failure of a fan (or other reason for termination of operation of at least one fan while other fans associated with the same air circulation system operate), the louvers or separately controlled louver system associated with the terminated or failed fan are closed. In disclosed embodiments, upon failure of a fan, the louvers or separately controlled louver system close above the failed fan close due to gravity and the force of the air flow from the remaining operational fans does not recirculate through the failed fan. Instead, the air moves across the components, thereby maintaining the temperature of the components at the manufacturer's specified temperature.

One or more of the louvers 210 that intersect one or more of the air transfer diverters 206 (e.g., louvers 210d-210g in FIG. 2) may be designed such that the louvers 210d-210g do not cover the intersected air transfer diverter 206. For example, the shielding portion of the louvers 210d-210g may be narrowed or eliminated along the segments of the louvers 210g-210g that intersect an air transfer diverter 206.

The self-activating louver systems are shown as integrated within the air collimator. However, it is within the principles of the invention to provide the self-activating louver systems separate but nevertheless adjacent to the air collimator.

Figure 3A:
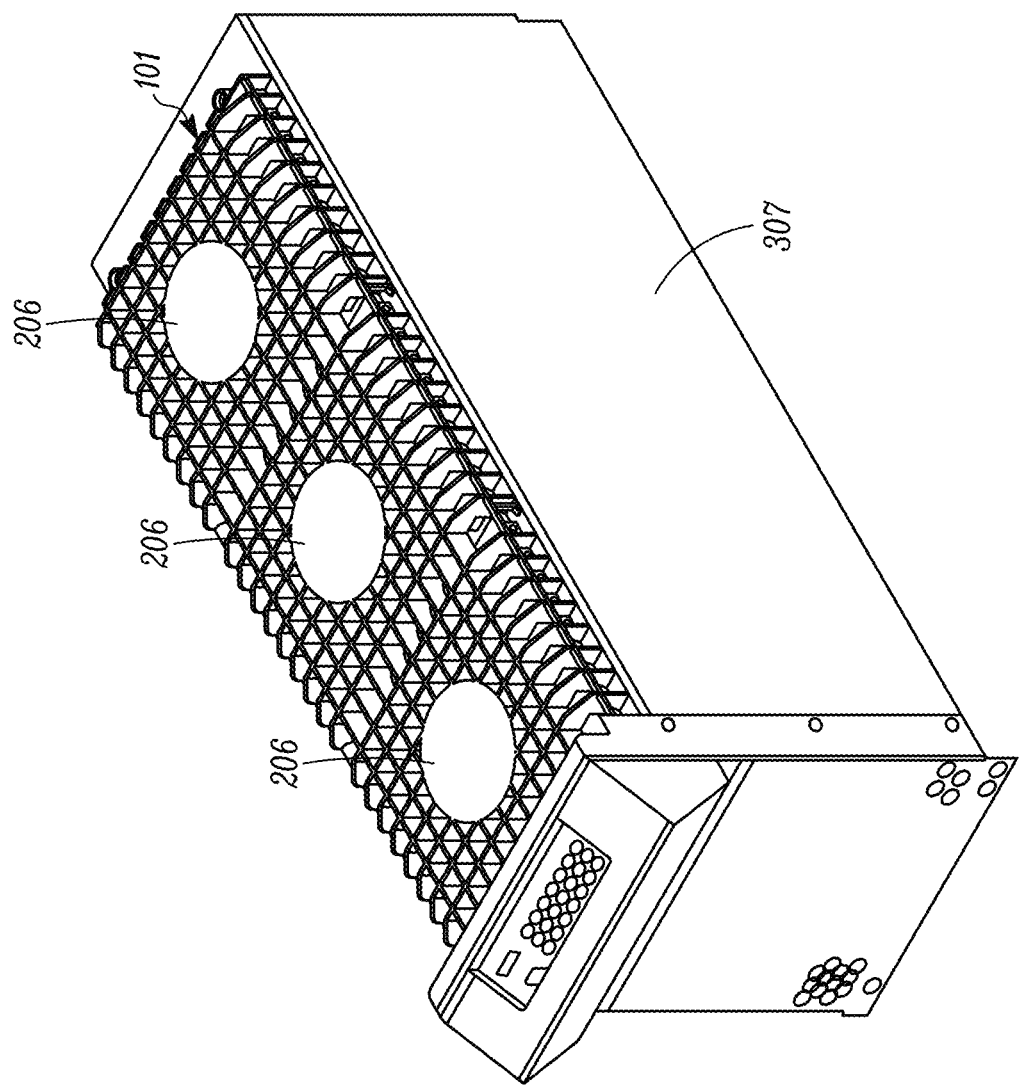
FIGS. 3A and 3B show an exemplary fan tray including multiple fans and an air collimator in accordance with the principles of the present invention.
Figure 3B:
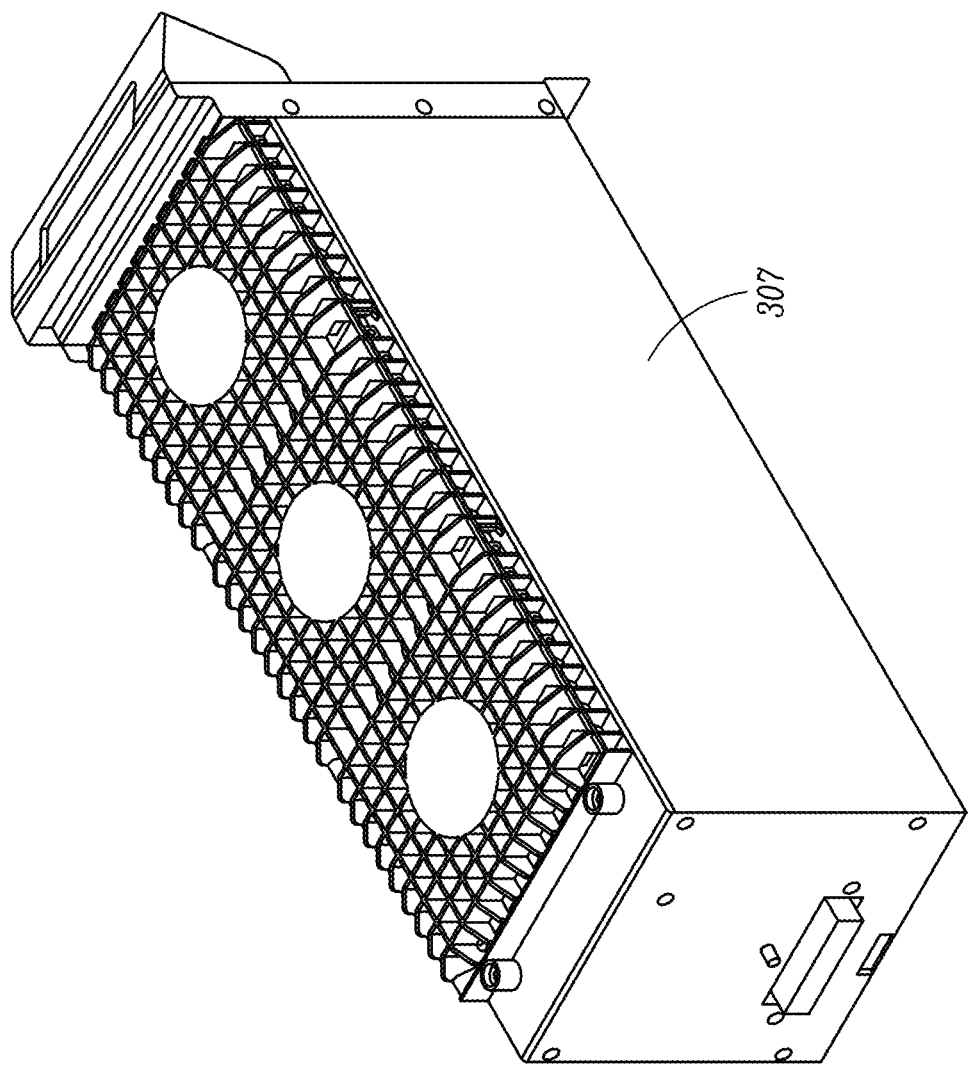

FIGS. 3A and 3B show an exemplary fan tray including multiple fans and an air collimator, and FIGS. 4A to 4D are top (FIG. 4A), side (FIG. 4B), rear (FIG. 4D) and cutaway (FIG. 4C) views showing the exemplary fan tray of FIGS. 3A and 3B.

In particular, a fan tray 307 encloses a plurality of fans 505, 605, 705. In the cutaway view of FIG. 4C the fan hubs 691 of each of the fans 505, 605, 705 can be seen (the blades of each of the fans are not shown).

In disclosed embodiments the diameter of the outer portion of the cylinder shaped air diverter 206 is preferably the same diameter as the fan hub (e.g., 59 mm). Preferably, the distance from the bottom of the cylinder air diverter 205 to the fan hub 691 is about 2 mm. The bottom of the cylinder air diverter 206 is open for molding purposes and is not important to the design. The top of the cylinder air diverter 206 is a flat blocked surface.

A purpose of the cylinder air diverter 206 along with the matrix of square openings 211 is to produce a system positive "Y" direction linear air flow parallel to heat sink fins (not shown) to be cooled by the air flow. A system filter (not shown) may be located, e.g., about an inch above the air collimator 101. An exemplary filter is approximately a 20% resistance to the air flow. As the air flows from the plurality of fans 505, 605, 705 it does not exit in a linear path but rather instead exits in a swirling pattern causing air flow vectors flowing in many directions. Observations of Flo-THERM simulations demonstrate that the air flow exits the fans 505, 605, 705, any linear flow passes through the filter and some angular air flow penetrates the filter. The balance of the flow moves towards the back of a chassis of devices being cooled. The area over each of the fan hubs 691 is a low pressure area and as the airflow exits the respective fans 505, 605, 705 it begins to recirculate over the hubs 691. The recirculation extends onto the surface of the board causing inefficient cooling. Because the air exits the air collimator 101 in a more linear pattern the hub cover (air diverter 206) eliminates any recirculating air below the air collimator 101 and filter, thus reducing the amount of recirculating that occurs below the filter or onto the surface of the board producing a more efficient cooling of components and an improved even distribution of air across the card cage. The cylinder air diverter 206 produces a converged linear air flow almost immediately reducing recirculation on the surface of the board. Without the air collimator 101 the recirculation extended vertically onto the board approximately, e.g., 50 to 75% of the height of the board over each fan hub 691. Note that this measurement is specific to the disclosed embodiment and may be more, less, or the same in other designs and configurations.

FIGS. 5A to 5F are top (FIG. 5A), cutaway (FIG. 5B), right side (FIG. 5C), front (FIG. 5D), rear (FIG. 5E), and bottom (FIG. 5F) views of the exemplary air collimator including cylindrical air transfer diverters of FIGS. 1 and 2, with all louvers in an open position due to all fans working.

Figure 5A:
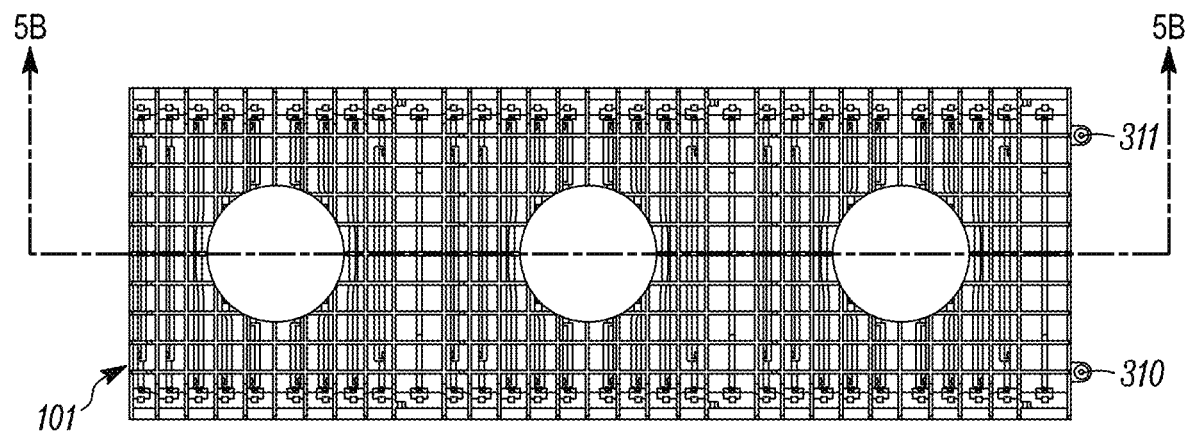
FIGS. 5A to 5F are top (FIG. 5A), cutaway (FIG. 5B), right side (FIG. 5C), front (FIG. 5D), rear (FIG. 5E), and bottom (FIG. 5F) views of the exemplary air collimator including cylindrical air transfer diverters of FIGS. 1 and 2, with all louvers in an open position due to all fans working.
Figure 5B:
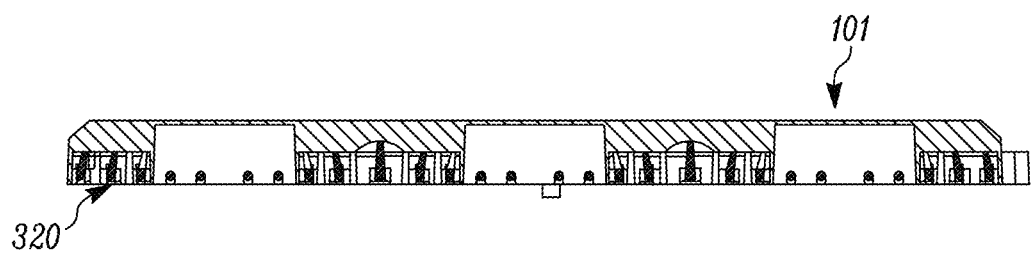
Figure 5C:
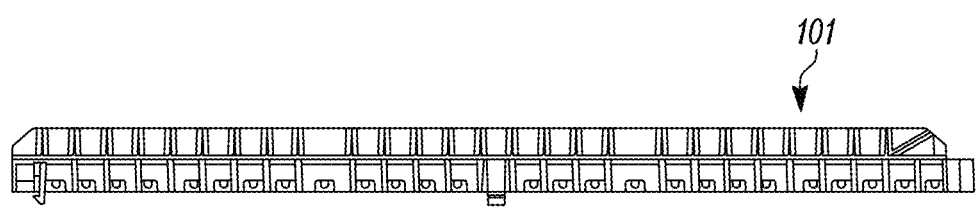
Figure 5D:
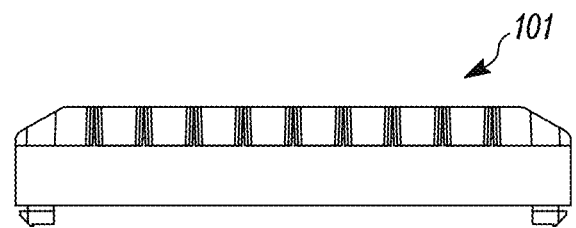
Figure 5E:
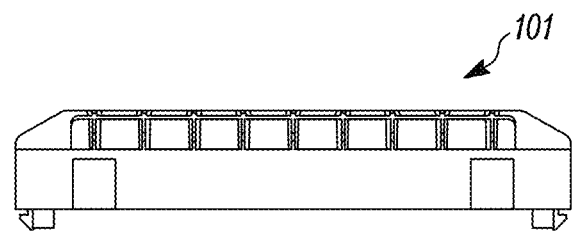
Figure 5F:
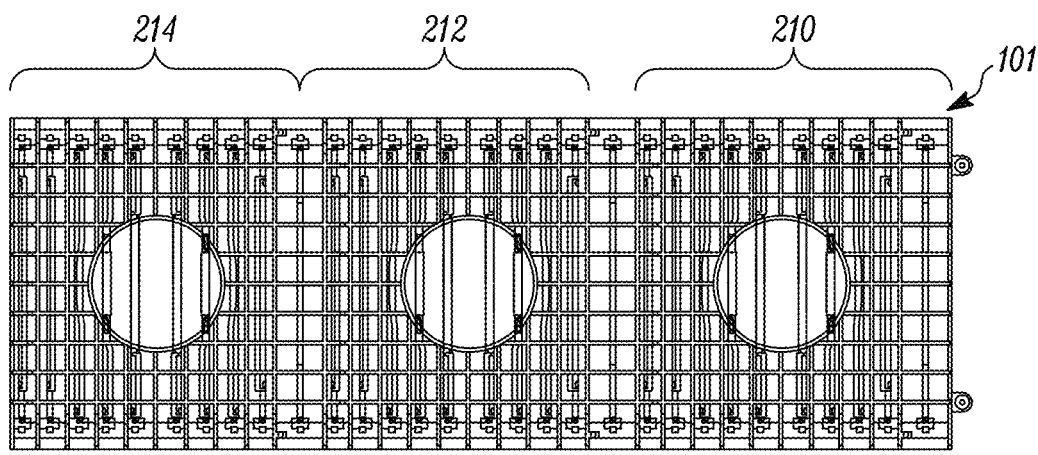

In particular, FIG. 5A is an elevation view showing the top of the exemplary air collimator 101; FIG. 5B is a cutaway view taken along section 5B-5B shown in FIG. 5A, FIG. 5C is an elevation view showing one side of the exemplary air collimator 101; FIG. 5D is an elevation view showing the front of the exemplary air collimator 101; and FIG. 5E is an elevation view showing the rear of the exemplary air collimator 101, and FIG. 5F is an elevation view showing the bottom of the exemplary air collimator 101;

An exemplary mounting design is seen in FIGS. 5A to 5F whereby protrusions or mounting hooks 320 are inserted into a chassis of the fan tray 307, and then screw mounting bosses 310, 311 are screwed in place. This provides for easy removal of the air collimator 101 when necessary, e.g., to access fan hubs mounted below.

For ease of manufacture, each end 271, 272 of each of the louvers may be marked with a character. Thus, each end 271, 272 is properly matched to the corresponding character on the air collimator 101 and installed into the corresponding character location on the air collimator 101 during manufacture.

FIGS. 5A-5F show all automatically-operated, separately-controlled louver systems in an open position, which is a normal scenario wherein all fans 505, 605, 705 in the fan tray 307 are operating. Importantly however, any of the separately-controlled louver systems are automatically closed upon failure or other outage of a respective fan 505, 605, 705.

Figure 6A:
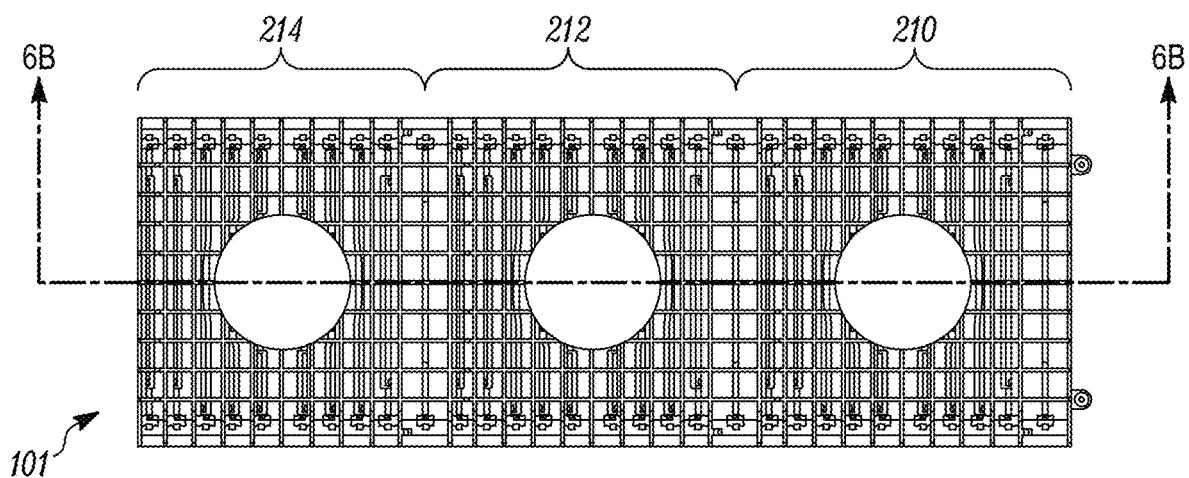
FIGS. 6A to 6C are top (FIG. 6A), cutaway (FIG. 6B), and bottom (FIG. 6C) views of the exemplary air collimator including cylindrical air transfer diverters of FIGS. 1 and 2, showing a failed middle fan position louvers in a closed position while the louvers associated with the other, working fans remain in an open position.
Figure 6B:
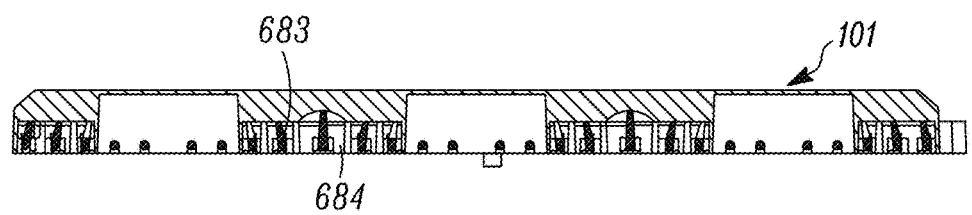
Figure 6C:
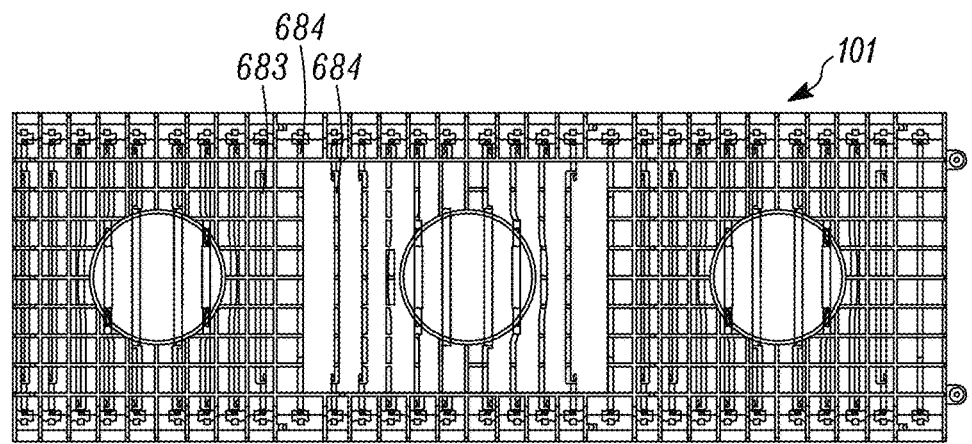
Figure 7:
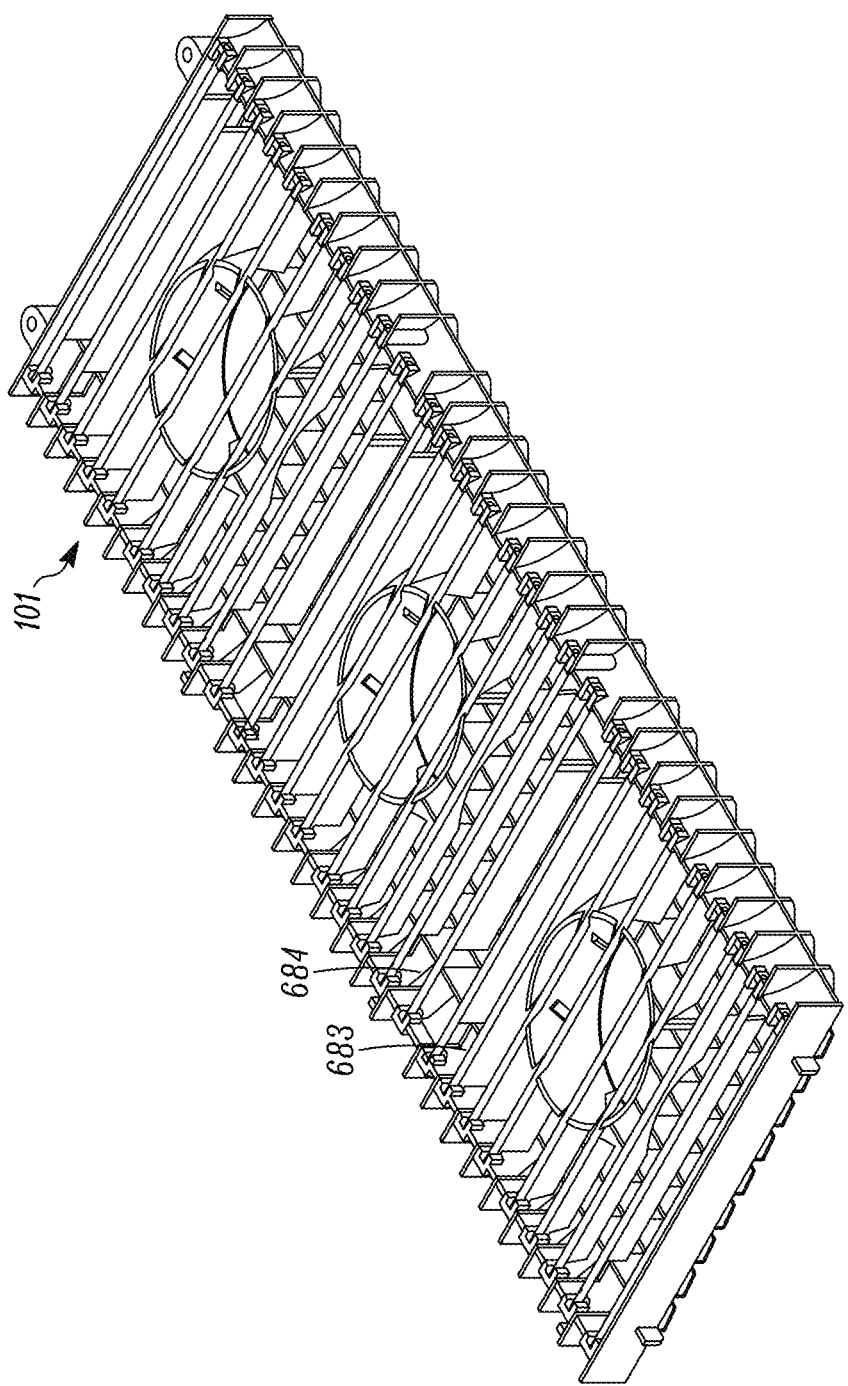
FIG. 7 is a perspective bottom view of the exemplary air collimator including cylindrical air transfer diverters of FIGS. 1 and 2, showing a failed middle fan position louvers in a closed position while the louvers associated with the other, working fans remain in an open position.
Figure 8A:
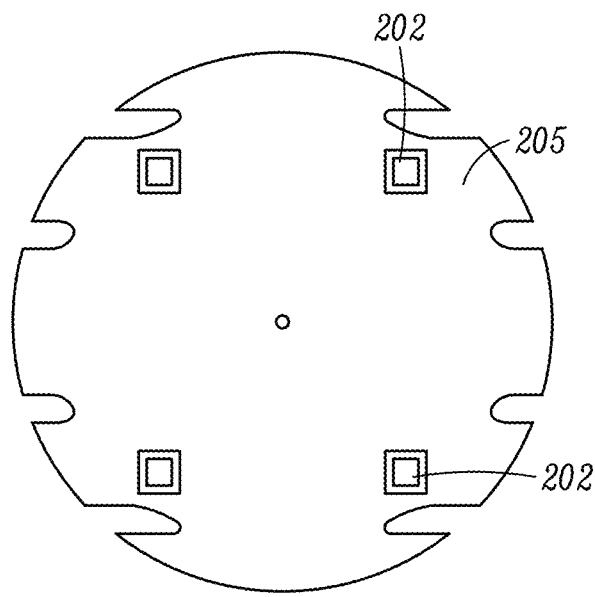
FIGS. 8A to 8D show another embodiment of an air transfer diverter in a conical shape, in accordance with another aspect of the invention.
Figure 8B:
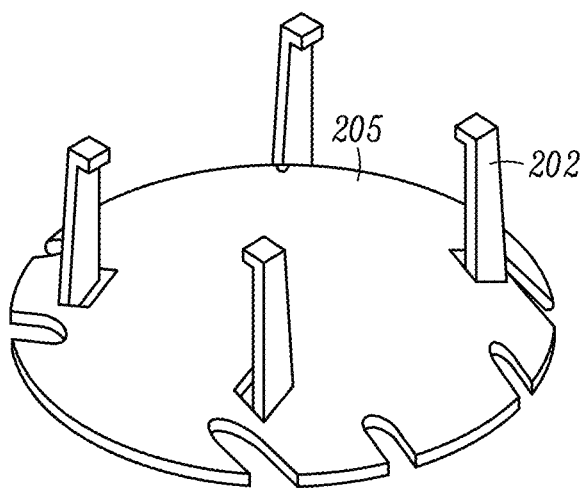
Figure 8C:
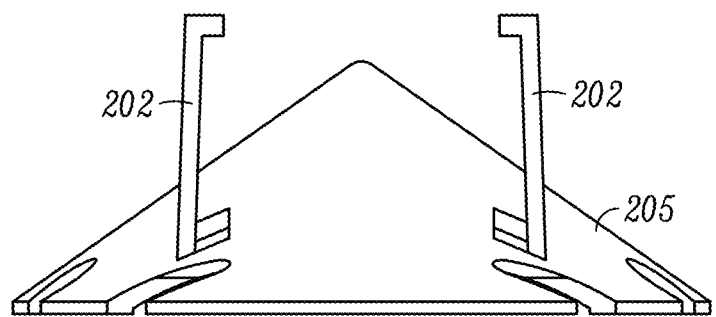
Figure 8D:
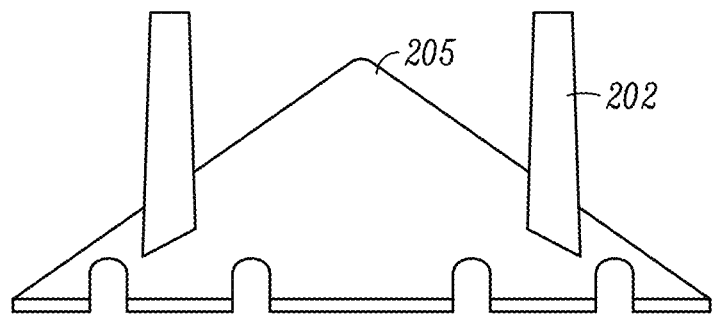

For instance, FIG. 6A is a top view; FIG. 6B is a cutaway view, FIG. 6C is a bottom view, and FIG. 7 is a perspective view of the bottom of the exemplary air collimator 101 including cylindrical air transfer diverters 206 of FIGS. 1 and 2, showing a middle louver system in a closed condition corresponding to an associated failed fan, while the louvers of other louver systems associated with the other, working fans remain in an open position. See, for instance, an exemplary louver 683 associated with an operating front fan position shown in an open position, while an adjacent louver 684 of an adjacent louver system is shown in a fan fail closed position. Air flow direction is depicted by the arrow below FIG. 6B.

When a given fan (e.g., middle fan 605) fails, the middle self-activating, separately-controlled louver system 212 automatically closes with the failure of the middle fan 605. Thus, the active louvers of the louver system 212 associated with the middle fan 605 are closed, thereby preventing recirculation of air back through the failed middle fan 605. Importantly, the active louvers of the other louver systems 210, 214 associated with remaining fans 505, 705 that continue to function remain open.

Thus, with automatic operation and closure of a louver system associated with a failed fan, most of the air entering the air cooling system through the remaining functioning fans 505, 705 continue to maintain a positive direction of air flow over the one or more heat sinks (not shown) above the fan tray 307 and/or other device components intended to be cooled by the linear air flow produced by the fan tray 307 including an air collimator 101 with automatically-controlled, separately-activated louver systems in accordance with the principles of the present invention.

Recirculation is greatly minimized around a failed fan. Thus, the automatically operating louvers of the self-activating, separately-controlled louver system 212 of the air collimator 101 significantly prevent recirculation.

Figure 9:
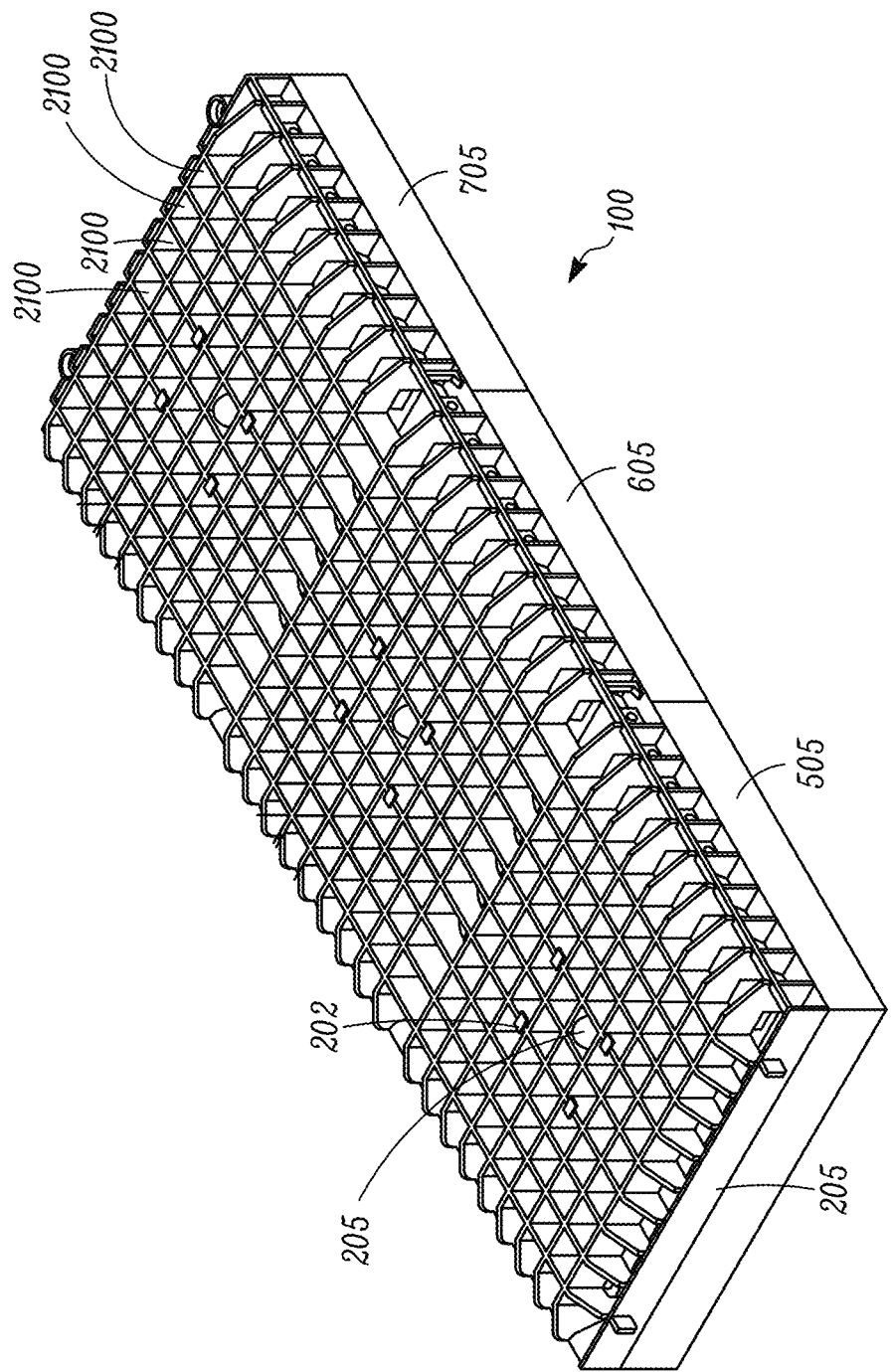
FIG. 9 shows a perspective top view of an example air collimator including a conical air transfer diverter for each fan and an integrated self-activating louver system associated with each fan, in accordance with the principles of the invention.

In particular, an air diverter 205 of a different shape, e.g., a conical shape, may be separately constructed and formed and mounted to an air collimator. In certain embodiments, an air collimator 100 (FIG. 9) includes a conical air transfer diverter 205 associated with each fan to create a linear flow of air from the circulating air flow of the fan. The conical air transfer diverters 205 may be fastened to the air collimator 100 in any appropriate fashion, e.g., using a plurality of fastening tabs 202 for attaching one or more air transfer diverters 205 to the air collimator 100. In FIG. 9 the plurality of fastening tabs 202 of the air transfer diverters 205 are shown in a secured position when integrated into the air collimator 100.

FIG. 9 shows a perspective top view of another embodiment of an air collimator 100 including a conical air transfer diverter 205 for each fan and an integrated self-activating louver system associated with each fan, in accordance with the principles of the invention.

In particular, as shown in FIG. 9, an air collimator 100 may include a plurality of rectangular openings that are spread across the air collimator 100 as a grid. While shown with square shaped openings in the air collimator 100, the openings may instead be square, quadrilateral, quadrangle, rhombus, or even form parallelograms, in accordance with the principles of the invention.

Air flow distribution provided by the air collimator 100 including conical shaped air transfer diverters 205 and separately activated louver systems as described herein facilitates and maintains a linear flow of air across the heat sinks of cooled device components to reliably and consistently maintain the operating temperature of the device components at a preferred temperature—even after the failure or outage of any one of a multiple number of cooling fans in the air cooling system.

In embodiments, the air flow distribution system may be installed within or otherwise attached to a headend device such as a CMTS. The air flow distribution system described herein includes an air collimator 100 comprising a plurality of openings 211 and a plurality of conical air transfer diverter mechanisms 205 that are operable to accept and redirect air from a plurality of fans 505, 605, 705. The air collimator 100 has a matrix of openings 211 and a conical shaped air transfer diverter 205 adapted for placement above each fan hub 505, 605, 705 to re-direct the swirling air flow pattern from individual fans 505, 605, 705 into a linear flow of air in the vertical direction above the fans, creating an improved optimal flow direction for cooling. The air collimator 100 increases the cross-sectional air flow distribution throughout a device or heat sink to be cooled while minimizing a low pressure area over any of the fan hubs 505, 605, 705 that would otherwise cause recirculation.

Each air transfer mechanism 205 redirects swirling air received from a fan into a linear vertical flow that is passed over one or more device components being cooled.

Figure 10:
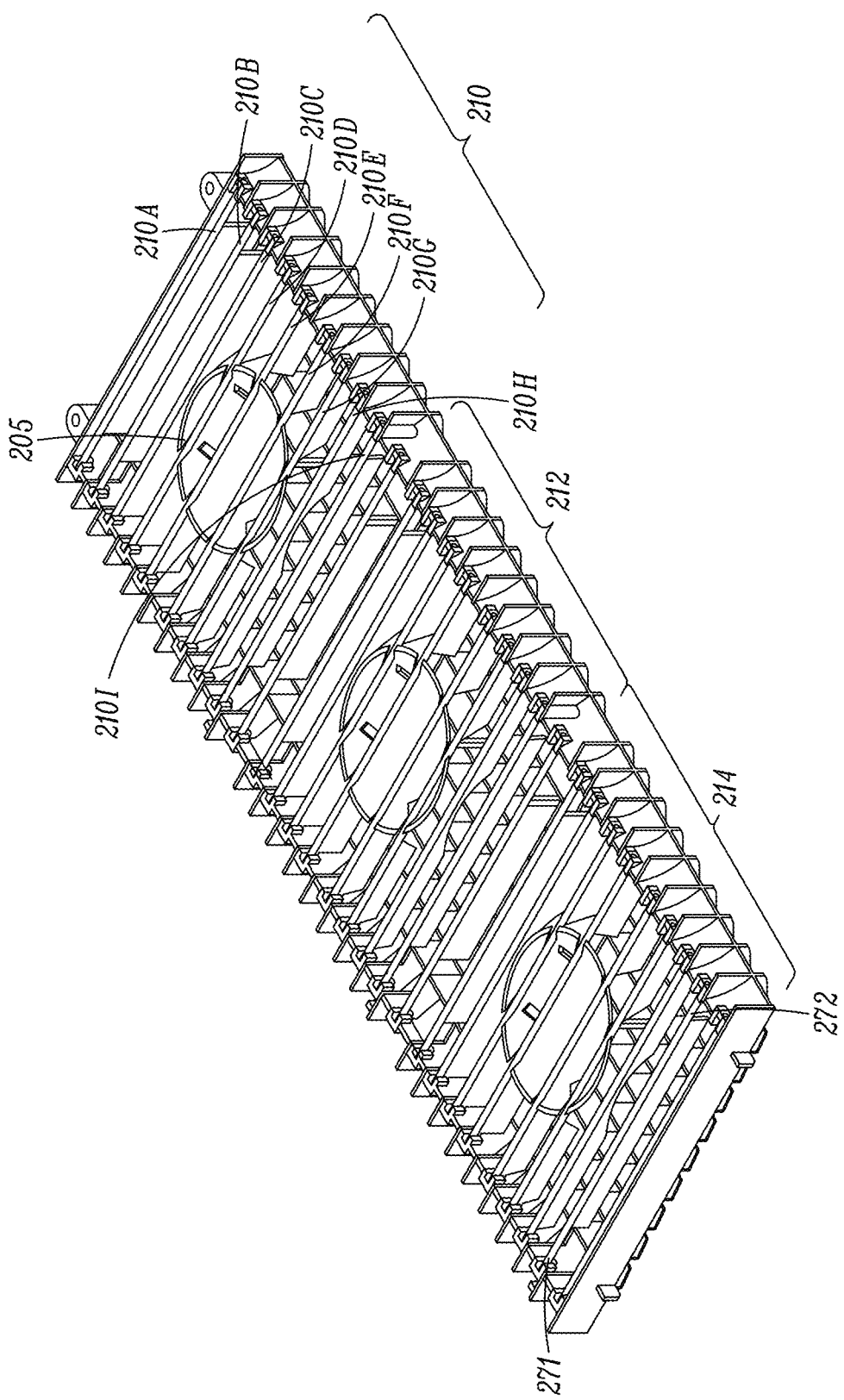
FIG. 10 shows a perspective bottom view of an exemplary air collimator including conical air transfer diverters and integrated self-activating, separately controlled louver systems, in accordance with an embodiment of the invention.

FIG. 10 shows a perspective bottom view of the exemplary air collimator 100 including conical air transfer diverters 205 and integrated self-activating, separately controlled louver systems 201, 212, 214, in accordance with an embodiment of the invention.

In particular, as shown in FIG. 10, the air collimator 100 includes a plurality of conical shaped air transfer diverters 205. Each conical air transfer diverter 205 prevents a low pressure volume from occurring over each fan hub 691. The conical air transfer diverters 205 prevent the low pressure volume over the fan hub 691. The square or rectangular matrix of openings 211 convert swirling air flow into linear air flow. The louvers of the individually controlled, self-activating louver systems 210, 212, 214 prevent failed fan recirculation.

Thus, in a multi-fan system, gravity and/or air pressure from the remaining operating fans will close separately controlled, individually activated louvers. Upon reactivation of a failed fan, the closed louvers will re-open.

In certain embodiments, each air transfer diverter 205 may be shaped as a cone, or funnel, or cup. It should be understood that the air transfer diverters 205 may be designed as other shapes as well (e.g., cylinders, funnel, cup).

While only three conical air transfer diverters 205 are shown in the disclosed embodiment of the air collimator 100 shown in FIGS. 9 and 10, it should be understood by those of ordinary skill that the number of air transfer diverters 205 within a given air collimator 100 may vary. For example, the number of conical air transfer diverters 205 within an air collimator 100 may be equivalent to the number of fans used to draw or force air through the air collimator 100.

In some embodiments, the air collimator 100 may include individually controlled louver systems 210, 212, 214. Each individual louver of the louver systems 210, 212, 214 may be attached to the air collimator 100 at two points (e.g., 271, 272) in such a way as to allow each individual louver of the louver systems 210, 212, 214 to freely rotate about an axis created between the two connection points 271, 272.

For example, in the disclosed embodiments, while an associated fan is blowing air through the air collimator 100, the pressure differential created by the fan forces each individual louver of a given louver system 210, 212, 214 open, but if an associated fan stops running, is turned off, or otherwise fails, gravity will cause the louvers associated with an individually controlled louver system 210, 212, 214 impacted by the stopped or failed fan to close. When closed, air is substantially prevented from passing back through the closed louver system 210, 212, 214.

While disclosed embodiments utilize an orientation of the air collimator to force air upwards in a linear direction such that the louvers may utilize gravity to fall closed in a given direction. However, the present invention is equally applicable to other orientations using gravity or active force such as spring force to close the louvers when air pressure ceases to maintain the louvers in an open position.

Thus in disclosed embodiments, the air collimator 100 includes self-activating individually controlled louver systems 210, 212, 214 wherein the louvers of each separate louver system 210, 212, 214 are held open while sufficient air pressure is applied to those louvers by the output of a respective one of the fans 505, 605, 705. The louvers are oriented such that upon the failure of the one fan 505, 605, 705 that is providing the sufficient pressure to maintain the louver in an open position while forcing air to pass through the louvers, gravity will force those louvers of that separately controlled louver system to close over just the failed fan, thereby preventing air from recirculating back through the failed fan.

Thus, all of the relevant louvers of all of the separately controlled louver systems 210, 212, 214, are open when all fans are operational. However, upon failure of a fan (or other reason for termination of operation of at least one fan while other fans associated with the same air circulation system operate), the louvers or separately controlled louver system associated with the terminated or failed fan are closed. In disclosed embodiments, upon failure of a fan, the louvers or separately controlled louver system close above the failed fan close due to gravity and the force of the air flow from the remaining operational fans does not recirculate through the failed fan. Instead, the air moves across the components, thereby maintaining the temperature of the components at the manufacturer's specified temperature.

One or more of the louvers 210 that intersect one or more of the conical air transfer diverter mechanisms 205 (e.g., louvers 210d-210g in FIG. 10) may be designed such that the louvers 210d-210g do not cover the intersected air transfer diverter mechanism 205. For example, the shielding portion of the louvers 210d-210g may be narrowed or eliminated along the segments of the louvers 210d-210g that intersect a conical air transfer diverter mechanism 205.

The self-activating louver systems are shown as integrated within the air collimator. However, it is within the principles of the invention to provide the self-activating louver systems separate but nevertheless adjacent to the air collimator.

Figure 11A:
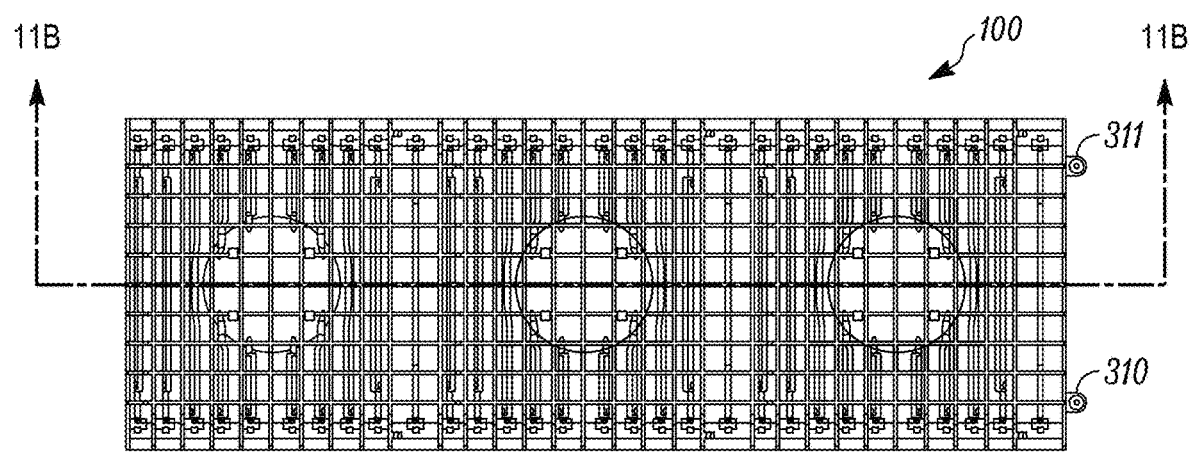
FIGS. 11A to 11B show elevation top and cutaway side view of the exemplary air collimator including conical air transfer diverters of FIGS. 9 and 10.
Figure 11B:
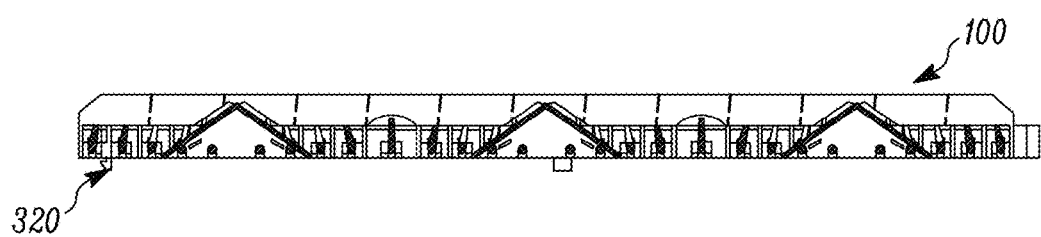

FIGS. 11A to 11B show elevation top and cutaway side view of the exemplary air collimator 100 including conical air transfer diverters 205 of FIGS. 9 and 10. FIG. 11A is an elevation view showing the top of the exemplary air collimator 100; FIG. 11B is a cutaway side view showing one side of the exemplary air collimator 100.

An exemplary mounting design is seen FIGS. 11A to 11B whereby protrusions 320 are inserted into a chassis, and then tabs 310, 311 are screwed in place. This provides for easy removal of the air collimator 100 when necessary, e.g., to access fan hubs mounted below.

Figure 12A:
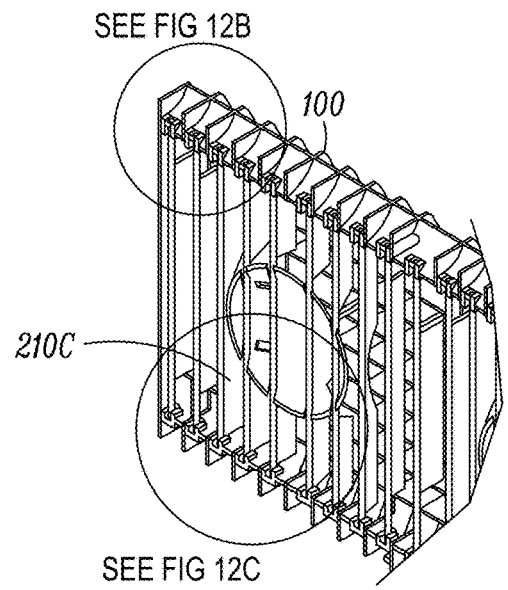
FIGS. 12A to 12C show example detail views of an exemplary air collimator including conical air transfer diverters and separately controlled louver systems associated with an air collimator in a multiple fan system, in accordance with the invention.
Figure 12B:
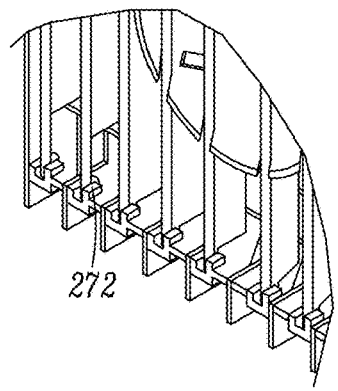
Figure 12C:
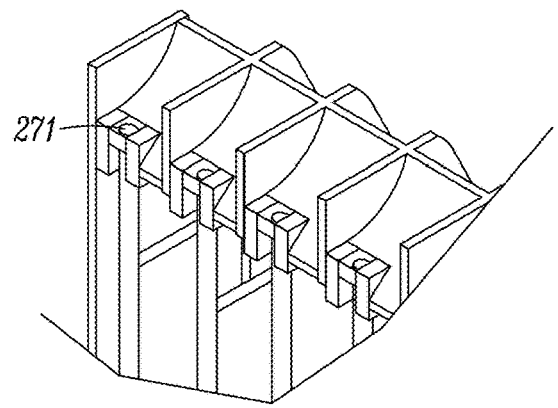

FIGS. 12A to 12C show example detail views of an exemplary air collimator 100 including conical air transfer diverters 205 and a separately controlled louver system 210 associated with an air collimator 100 in a multiple fan system, in accordance with the invention. FIG. 12A is a detailed view of the air collimator 100 showing the associated air transfer diverter 205 and louvers; FIG. 12B is a detailed close-up of a corner portion of the air collimator 100 identified in FIG. 12A; and FIG. 12C is a detailed close-up of an edge portion of the air collimator 100 shown in FIG. 12A.

For ease of manufacture, each end 271, 272 of the louver may be marked with a character. Thus, each end 271, 272 is properly matched to the corresponding character on the air collimator 100 and installed into the corresponding character location on the air collimator 100 during manufacture.

Figure 13:
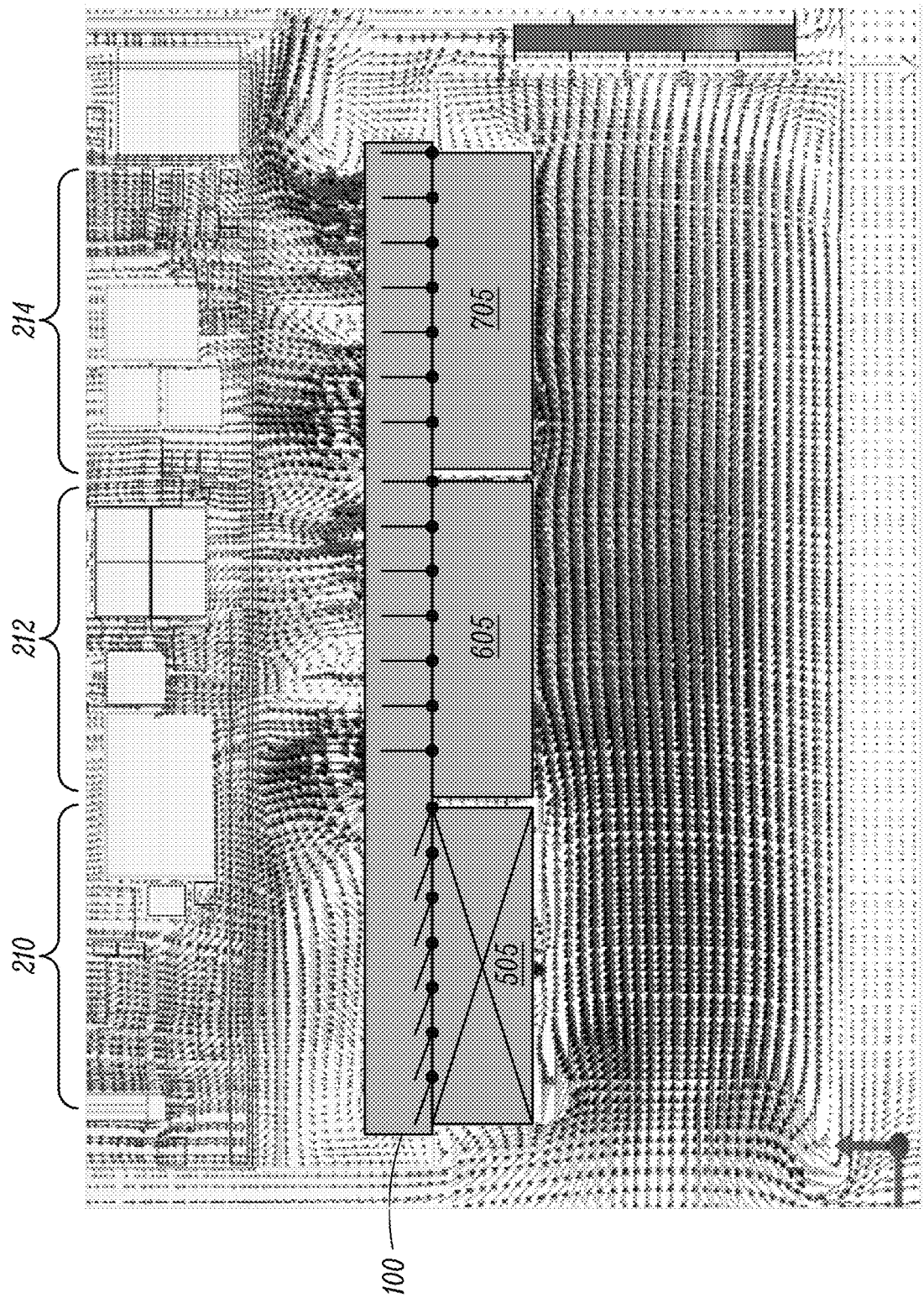
FIG. 13 shows exemplary computational fluid dynamic results with velocity vectors demonstrating the minimized recirculation that occurs when a first fan fails with an air collimator including separately controlled and self-activating louver systems, in accordance with the principles of the present invention.

FIG. 13 shows exemplary computational fluid dynamic results with velocity vectors demonstrating the minimized recirculation that occurs when a first fan 505 fails with an air collimator 100 including separately controlled and self-activating louver systems 210, 212, 214, in accordance with the principles of the present invention.

In particular, FIG. 13 depicts a situation when a given fan (e.g., a front fan) 505 fails. As depicted in FIG. 13, a first self-activating separately controlled louver system 210 automatically closes with the failure of the front fan 505. Thus, the active louvers of the louver system 210 associated with the first fan 505 are closed, thereby preventing recirculation of air back through the failed front fan 505. Importantly, the active louvers of the other louver systems 212, 214 associated with remaining fans 605, 705 that continue to function remain open.

This causes most of the air entering the air cooling system through the remaining functioning fans to maintain a positive direction of air flow over the one or more heat sinks and/or device components intended to be cooled by the linear air flow.

As can be seen in FIG. 13, recirculation is greatly minimized around the failed front fan 505 as shown by the minimal vectors that are traveling in a negative 'y-direction' back through the failed front fan 505. Most of the air flow entering the system maintains a generally linear path in a positive 'y-direction' to pass over the heat sinks and components being cooled.

Thus, the active louvers of the self-activating separately controlled louver system 210 of the air collimator 100 significantly prevents recirculation as demonstrated in the simulation image of FIG. 13.

Figure 14:
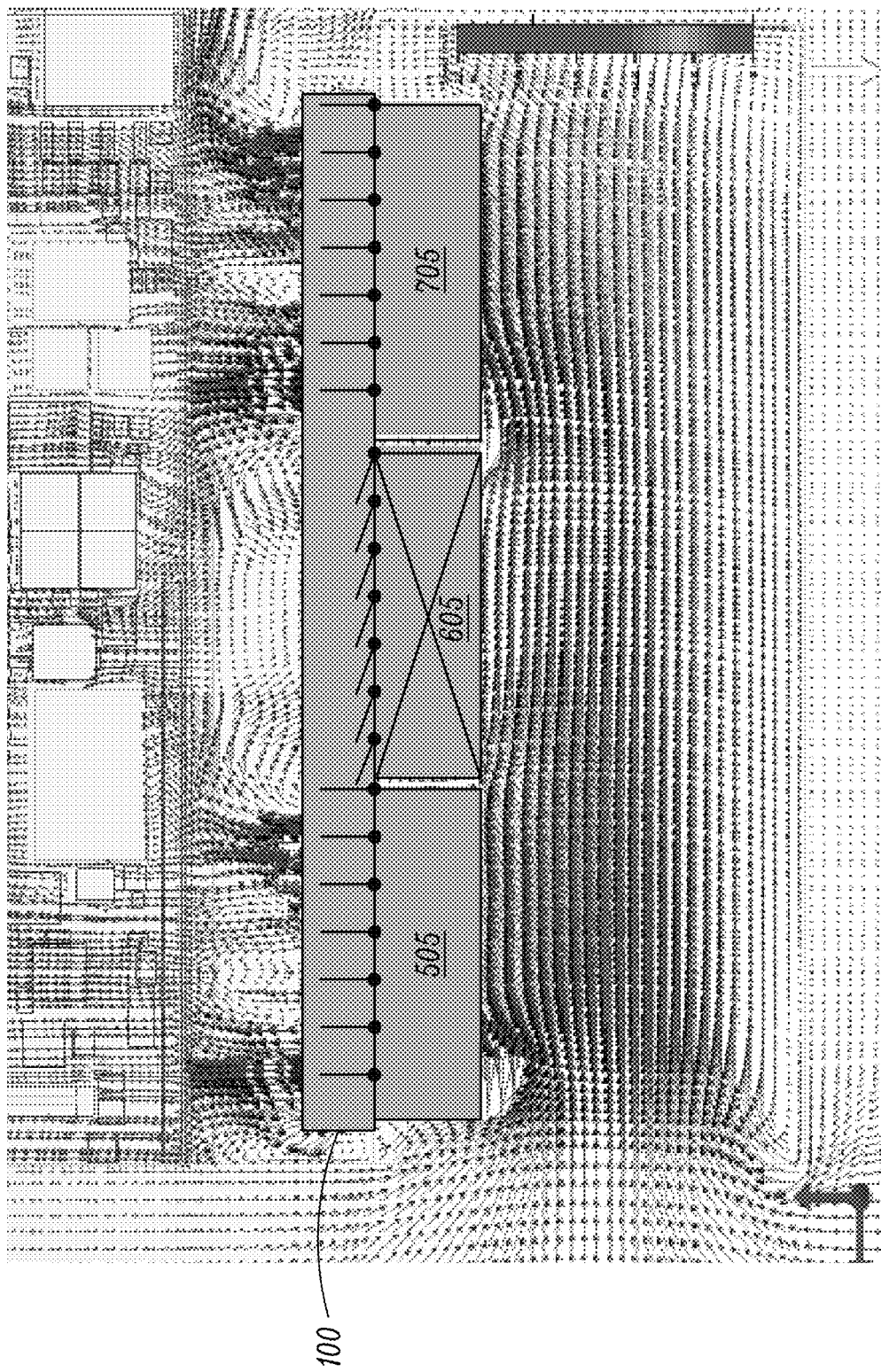
FIG. 14 shows exemplary computational fluid dynamic results with velocity vectors demonstrating the minimized recirculation that occurs when a different fan, e.g., center fan fails with an air collimator including separately controlled and self-activating louver systems, in accordance with the principles of the present invention.

FIG. 14 shows exemplary computational fluid dynamic results with velocity vectors demonstrating the minimized recirculation that occurs when a different fan, e.g., center fan 605 fails with an air collimator 100 including separately controlled and self-activating louver systems 210, 212, 214, in accordance with the principles of the present invention.

In particular, as shown in FIG. 14, when a center fan 605 fails in, e.g., a three fan air cooling system, the active louvers associated with the self-activating separately controlled second louver system 212 are automatically closed, thereby preventing recirculation of air back through the failed center fan 605, and allowing most of the linear air flow entering the system to maintain a positive 'y-direction' over the one or more heat sinks and/or device components being cooled. The minimized recirculation can be seen in FIG. 14 by the minimal vectors that are traveling in a negative 'y-direction' back through the center fan 605 when the second fan 605 fails.

Thus, the active louvers of the self-activating separately controlled louver system 212 of the air collimator 100 significantly prevents recirculation as demonstrated in the simulation image of FIG. 14.

Figure 15:
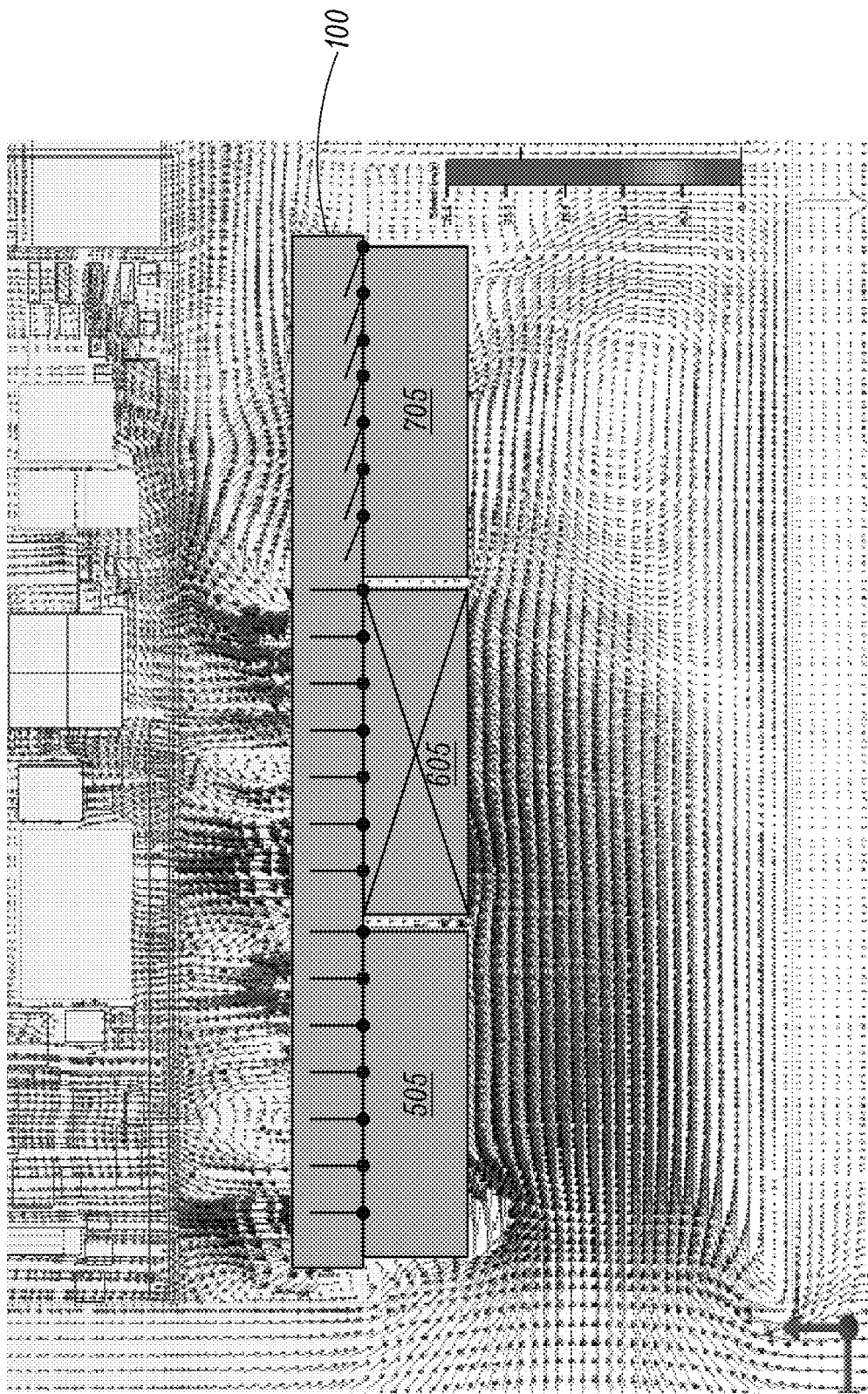
FIG. 15 shows exemplary computational fluid dynamic results with velocity vectors demonstrating the minimized recirculation that occurs when a rear fan fails with an air collimator including separately controlled and self-activating louver systems, in accordance with the principles of the present invention.
Figure 16:
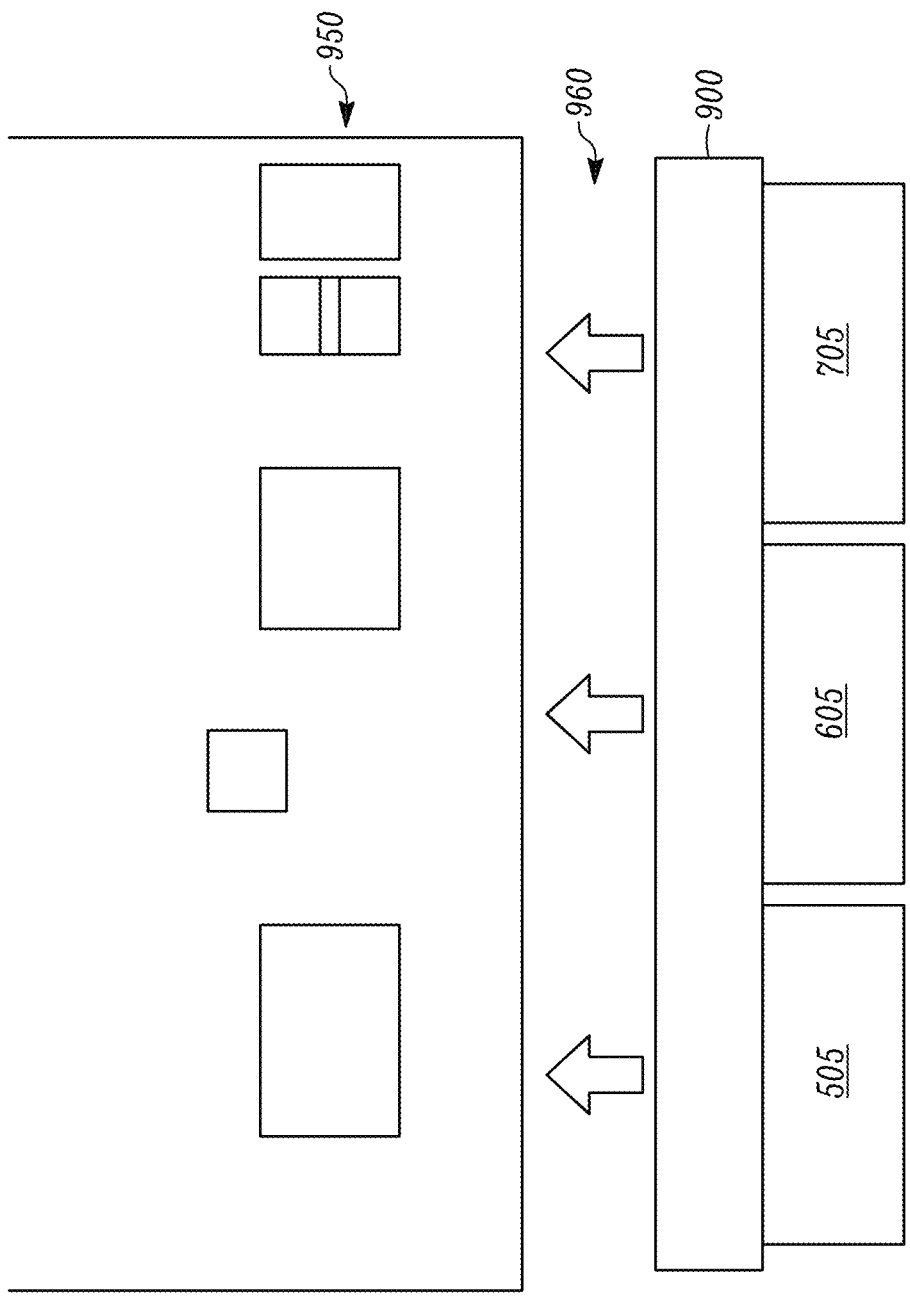
FIG. 16 shows a conventional air cooling system including three fans blowing cooling air toward a number of heat sinks of devices through a conventional air collimator.

FIG. 15 shows exemplary computational fluid dynamic results with velocity vectors demonstrating the minimized recirculation that occurs when a rear fan 705 fails with an air collimator 100 including separately controlled and self-activating louver systems 210, 212, 214, in accordance with the principles of the present invention.

In particular, as shown in FIG. 15, when a fan in a different position fails, e.g., rear fan 705, the active louvers of the separately controlled louver system 214 associated with the rear fan 705 automatically close upon cessation of the air flow output of the rear fan 705. The closed louvers substantially prevent recirculation of air back through the failed rear fan 705 to cause most of the air flow entering the system to maintain a positive, linear 'y-direction' over one or more heat sinks and/or device components. The minimized recirculation can be seen in FIG. 15 by the minimal vectors that are traveling in a negative 'y-direction' back through the failed rear fan 705.

The conical air diverter 205 was an attempt to accomplish the same function as the cylindrical air diverter 206. The base of the conical air diverter 205 covered the fan hub 691 and the intent was for the air flow to converge as it went beyond the conical air diverter 205. In practice the conical air diverter 205 presented a molding challenge that could only be overcome by having a separate air collimator 100 and three conical air diverters 205. The cylinder geometry of the cylindrical air diverter 206 improved the air flow better than the conical air diverter 205 and the geometry of the cylindrical air diverter 206 could be molded more easily as part of the air collimator 101. Thus, the cylindrical air diverter 206 reduced the assembly part count (excluding louver part count) of the air collimator 101 from four (in the case of the air collimator 100) to one.

Thus, the active louvers of the self-activating separately controlled louver system 214 of the air collimator 100 significantly prevents recirculation as demonstrated in the simulation image of FIG. 15.

While the invention is described with reference to failure of one or more air circulation fans, the invention relates equally to termination of an air circulation fan for any reason, including maintenance, service or repair. Moreover, the air circulation fan termination may be a permanent failure or temporary outage for whatever reason.

While the invention has been described with reference to the exemplary embodiments thereof, those skilled in the art will be able to make various modifications to the described embodiments of the invention without departing from the true spirit and scope of the invention.

What is claimed is:

1. An air cooling system comprising:
a plurality of fans;
an air collimator adapted to direct forced air flow by each of the plurality of fans toward at least one device to be cooled, wherein the air collimator comprises a plurality of openings that are spread across the air collimator as a grid, and a plurality of tubular or conical air transfer diverters with a closed downstream end mounted to the air collimator to prevent low pressure volume over the respective fan hubs, each diverter having an outer periphery; and
a plurality of self-activating, separately controlled louver systems mounted to the air collimator and each surrounding the outer periphery of a respective one of the plurality of air transfer diverters, wherein each respective one louver system is associated with a respective fan of the plurality of fans, and wherein each respective one louver system comprises a plurality of louvers,
wherein the plurality of self-activating, separately controlled louver systems are each adapted to self-close individually upon cessation of air flow from the respective fan associated with the louver system to block air from passing back through the respective fan when the respective fan is off.

2. The air cooling system according to claim 1, wherein:
each of the plurality of air transfer diverters pass through a respective one of the plurality of separately controlled louver systems which prevent failed fan recirculation.

3. The air cooling system according to claim 1, wherein:
each of the plurality of air transfer diverters is conical shaped.

4. The air cooling system according to claim 1, wherein:
each of the plurality of air transfer diverters is cylindrical shaped.

5. The air cooling system according to claim 1, wherein:
the air collimator is mounted in a position above the plurality of fans.

6. The air cooling system according to claim 1, wherein:
the plurality of self-activating, separately controlled louver systems each comprise a plurality of louvers;
wherein each of the plurality of louvers is adapted to close in a given direction when an associated one of the plurality of fans stops air flow therethrough.

7. The air cooling system according to claim 6, wherein:
each of the plurality of louvers is adapted to close due to gravity.

8. The air cooling system according to claim 6, wherein:
each of the plurality of louvers is adapted to close due to air pressure of operating fans.

9. The air cooling system according to claim 1, wherein:
the plurality of fans force air flow through the air collimator.

10. An air collimator for a multiple forced air-source air cooling system, comprising:
an air collimator adapted to direct forced air flow by each of a plurality of separate air sources toward at least one device to be cooled, wherein the air collimator comprises a plurality of openings that are spread across the air collimator as a grid, and a plurality of tubular or conical air transfer diverters with a closed downstream end mounted to the air collimator to prevent low pressure volume over the respective fan hubs, each diverter having an outer periphery; and
a plurality of self-activating, separately controlled louver systems mounted to the air collimator and each surrounding the outer periphery of a respective one of the plurality of air transfer diverters, wherein each respective one louver system is associated with a respective air source of the plurality of separate air sources, and wherein each respective one louver system comprises a plurality of louvers, wherein the plurality of self-activating, separately controlled louver systems are each adapted to self-close individually upon cessation of air flow from the respective air source associated with the louver system to block air from passing back through the self-closed self-activating, separately controlled louver system.

11. The air collimator for a multiple forced air-source air cooling system according to claim 10, wherein:
   each of the plurality of air transfer diverters is conical shaped.

12. The air collimator for a multiple forced air-source air cooling system according to claim 11, wherein:
   each of the plurality of air transfer diverters is cylindrical shaped.

13. A method of providing consistent linear flow across a device from a multiple-fan air cooling system, comprising:
   passing the output from a plurality of fans through an air collimator toward at least one device to be cooled, the air collimator, including a plurality of tubular or conical air transfer diverters with a closed downstream end to prevent low pressure volume over the respective fan hubs, each diverter having an outer periphery, the air collimator including a plurality of self-activating, separately controlled louver systems mounted to the air collimator and each surrounding the outer periphery of a respective one of the plurality of air transfer diverters, wherein each respective one louver system is associated with a respective one fan of the plurality of fans, wherein the air collimator comprises a plurality of openings that are spread across the air collimator as a grid, and wherein each respective one louver system comprises a plurality of louvers,
   self-closing at least one but not all of the plurality of self-activating, separately controlled louver systems mounted to the air collimator upon cessation of air flow from a failed one of the plurality of fans while the remaining plurality of fans continue to force air through the air collimator, the closed self-activating, separately controlled louver system blocking air from passing back through the failed one of the plurality of fans while the remaining plurality of fans continue to pass air through the air collimator;
   wherein the louver system above the failed one of the plurality of cooling fans closes to block passage of air flow from any of the remaining plurality of fans from passing therethrough.

* * * * *